US007330041B2

(12) United States Patent
McFadden

(10) Patent No.: US 7,330,041 B2
(45) Date of Patent: Feb. 12, 2008

(54) LOCALIZING A TEMPERATURE OF A DEVICE FOR TESTING

(75) Inventor: Bruce McFadden, Hillsboro, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 11/086,126

(22) Filed: Mar. 21, 2005

(65) Prior Publication Data

US 2005/0287685 A1  Dec. 29, 2005

Related U.S. Application Data

(60) Provisional application No. 60/579,751, filed on Jun. 14, 2004.

(51) Int. Cl.
*G01R 31/02* (2006.01)

(52) U.S. Cl. .................. 324/760; 324/751; 324/754

(58) Field of Classification Search ............... None
See application file for complete search history.

(56) References Cited

U.S. PATENT DOCUMENTS

| 1,337,866 | A | 4/1920 | Whitaker |
| 2,142,625 | A | 1/1939 | Zoethout |
| 2,197,081 | A | 4/1940 | Piron |
| 2,376,101 | A | 5/1945 | Tyzzer |
| 2,389,668 | A | 11/1945 | Johnson |
| 2,471,897 | A | 5/1949 | Rappl |
| 2,812,502 | A | 11/1957 | Doherty |
| 3,176,091 | A | 3/1965 | Hanson et al. |
| 3,185,927 | A | 5/1965 | Margulis et al. |
| 3,192,844 | A | 7/1965 | Szasz et al. |
| 3,193,712 | A | 7/1965 | Harris |
| 3,201,721 | A | 8/1965 | Voelcker |
| 3,230,299 | A | 1/1966 | Radziejowski |
| 3,256,484 | A | 6/1966 | Terry |
| 3,265,969 | A | 8/1966 | Catu |
| 3,289,046 | A | 11/1966 | Carr |
| 3,333,274 | A | 7/1967 | Forcier |
| 3,405,361 | A | 10/1968 | Kattner et al. |
| 3,408,565 | A | 10/1968 | Frick et al. |

(Continued)

FOREIGN PATENT DOCUMENTS

CN  1083975  3/1994

(Continued)

OTHER PUBLICATIONS

Christophe Risacher, Vessen Vassilve, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 262-264.

(Continued)

*Primary Examiner*—Minh N. Tang
(74) *Attorney, Agent, or Firm*—Chernoff, Vilhauer, McClung & Stenzel

(57) ABSTRACT

Wafers or other structures comprising a plurality of dies or devices are tested at non-ambient temperatures by inducing a first heat flux through a substantial portion of a surface of the structure to modify a temperature of the structure and inducing a second heat flux through a local area of a surface of the structure, proximate the device under test, to modify the temperature the device under test.

36 Claims, 10 Drawing Sheets

U.S. PATENT DOCUMENTS

| | | |
|---|---|---|
| 3,435,185 A | 3/1969 | Gerard |
| 3,484,679 A | 12/1969 | Hodgson et al. |
| 3,596,228 A | 7/1971 | Reed, Jr. et al. |
| 3,602,845 A | 8/1971 | Agrios et al. |
| 3,609,539 A | 9/1971 | Gunthert |
| 3,648,169 A | 3/1972 | Wiesler |
| 3,654,573 A | 4/1972 | Graham |
| 3,662,318 A | 5/1972 | Decuyper |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,775,644 A | 11/1973 | Cotner et al. |
| 3,777,260 A | 12/1973 | Davies et al. |
| 3,810,017 A | 5/1974 | Wiesler et al. |
| 3,814,888 A | 6/1974 | Bowers et al. |
| 3,829,076 A | 8/1974 | Sofy |
| 3,858,212 A | 12/1974 | Tompkins et al. |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,976,959 A | 8/1976 | Gaspari |
| 3,992,073 A | 11/1976 | Buchoff et al. |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,135,131 A | 1/1979 | Larsen et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | delRio |
| 4,284,682 A | 8/1981 | Frosch et al. |
| 4,287,473 A | 9/1981 | Sawyer |
| 4,327,180 A | 4/1982 | Chen |
| 4,330,783 A | 5/1982 | Toia |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,383,217 A | 5/1983 | Shiell |
| 4,401,945 A | 8/1983 | Juengel |
| 4,414,638 A | 11/1983 | Talambrias |
| 4,419,626 A | 12/1983 | Cedrone et al. |
| 4,425,395 A | 1/1984 | Negishi et al. |
| 4,426,619 A | 1/1984 | Demand |
| 4,453,142 A | 6/1984 | Murphy |
| 4,468,629 A | 8/1984 | Choma, Jr. |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,532,423 A | 7/1985 | Tojo et al. |
| 4,552,033 A | 11/1985 | Marzhauser |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,950 A | 5/1986 | Henley |
| 4,588,970 A | 5/1986 | Donecker et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,651,115 A | 3/1987 | Wu |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,883 A | 8/1987 | Ackerman et al. |
| 4,691,163 A | 9/1987 | Blass et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,705,447 A | 11/1987 | Smith |
| 4,711,563 A | 12/1987 | Lass |
| 4,712,370 A | 12/1987 | MacGee |
| 4,713,347 A | 12/1987 | Mitchell et al. |
| 4,725,793 A | 2/1988 | Igarashi |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,742,571 A | 5/1988 | Letron |
| 4,744,041 A | 5/1988 | Strunk et al. |
| 4,746,857 A | 5/1988 | Sakai et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,758,785 A | 7/1988 | Rath |
| 4,759,712 A | 7/1988 | Demand |
| 4,766,384 A | 8/1988 | Kleinberg et al. |
| 4,771,234 A | 9/1988 | Cook et al. |
| 4,772,846 A | 9/1988 | Reeds |
| 4,777,434 A | 10/1988 | Miller et al. |
| 4,780,670 A | 10/1988 | Cherry |
| 4,783,625 A | 11/1988 | Harry et al. |
| 4,784,213 A | 11/1988 | Eager et al. |
| 4,786,867 A | 11/1988 | Yamatsu |
| 4,787,752 A | 11/1988 | Fraser et al. |
| 4,791,363 A | 12/1988 | Logan |
| 4,795,962 A | 1/1989 | Yanagawa et al. |
| 4,805,627 A | 2/1989 | Klingenbeck et al. |
| 4,810,981 A | 3/1989 | Herstein |
| 4,812,754 A | 3/1989 | Tracy et al. |
| 4,816,767 A | 3/1989 | Cannon et al. |

| | | | | | |
|---|---|---|---|---|---|
| 4,818,169 A | 4/1989 | Schram et al. | 5,144,228 A | 9/1992 | Sorna et al. |
| 4,827,211 A | 5/1989 | Strid et al. | 5,159,264 A | 10/1992 | Anderson |
| 4,831,494 A | 5/1989 | Arnold et al. | 5,159,267 A | 10/1992 | Anderson |
| 4,838,802 A | 6/1989 | Soar | 5,159,752 A | 11/1992 | Mahant-Shetti et al. |
| 4,839,587 A | 6/1989 | Flatley et al. | 5,160,883 A | 11/1992 | Blanz |
| 4,845,426 A | 7/1989 | Nolan et al. | 5,164,319 A | 11/1992 | Hafeman et al. |
| 4,849,689 A | 7/1989 | Gleason | 5,164,661 A | 11/1992 | Jones |
| 4,853,613 A | 8/1989 | Sequeira et al. | 5,166,606 A | 11/1992 | Blanz |
| 4,853,624 A | 8/1989 | Rabjohn | 5,172,049 A | 12/1992 | Kiyokawa et al. |
| 4,853,627 A | 8/1989 | Gleason et al. | 5,172,051 A | 12/1992 | Zamborelli |
| 4,856,426 A | 8/1989 | Wirz | 5,187,443 A | 2/1993 | Bereskin |
| 4,856,904 A | 8/1989 | Akagawa | 5,198,752 A | 3/1993 | Miyata et al. |
| 4,858,160 A | 8/1989 | Strid et al. | 5,198,753 A | 3/1993 | Hamburgen |
| 4,859,989 A | 8/1989 | McPherson | 5,198,756 A | 3/1993 | Jenkins et al. |
| 4,864,227 A | 9/1989 | Sato | 5,198,758 A | 3/1993 | Iknaian et al. |
| 4,871,883 A | 10/1989 | Guiol | 5,202,558 A | 4/1993 | Barker |
| 4,871,965 A | 10/1989 | Elbert et al. | 5,209,088 A | 5/1993 | Vaks |
| 4,884,026 A | 11/1989 | Hayakawa et al. | 5,210,485 A | 5/1993 | Kreiger et al. |
| 4,884,206 A | 11/1989 | Mate | 5,214,243 A | 5/1993 | Johnson |
| 4,888,550 A | 12/1989 | Reid | 5,214,374 A | 5/1993 | St. Onge |
| 4,891,584 A | 1/1990 | Kamieniecki et al. | 5,218,185 A | 6/1993 | Gross |
| 4,893,914 A | 1/1990 | Hancock et al. | 5,220,277 A | 6/1993 | Reitinger |
| 4,894,612 A | 1/1990 | Drake et al. | 5,221,905 A | 6/1993 | Bhangu et al. |
| 4,896,109 A | 1/1990 | Rauscher | 5,225,037 A | 7/1993 | Elder et al. |
| 4,899,998 A | 2/1990 | Teramachi | 5,225,796 A | 7/1993 | Williams et al. |
| 4,904,933 A | 2/1990 | Snyder et al. | 5,227,730 A | 7/1993 | King et al. |
| 4,904,935 A | 2/1990 | Calma et al. | 5,232,789 A | 8/1993 | Platz et al. |
| 4,906,920 A | 3/1990 | Huff et al. | 5,233,197 A | 8/1993 | Bowman et al. |
| 4,916,398 A | 4/1990 | Rath | 5,233,306 A | 8/1993 | Misra |
| 4,918,279 A | 4/1990 | Babel et al. | 5,237,267 A | 8/1993 | Harwood et al. |
| 4,918,374 A | 4/1990 | Stewart et al. | 5,245,292 A | 9/1993 | Milesky et al. |
| 4,918,383 A | 4/1990 | Huff et al. | 5,266,889 A | 11/1993 | Harwood et al. |
| 4,922,128 A | 5/1990 | Dhong et al. | 5,267,088 A | 11/1993 | Nomura |
| 4,922,186 A | 5/1990 | Tsuchiya et al. | 5,270,664 A | 12/1993 | McMurtry et al. |
| 4,923,407 A | 5/1990 | Rice et al. | 5,274,336 A | 12/1993 | Crook et al. |
| 4,926,118 A | 5/1990 | O'Connor et al. | 5,278,494 A | 1/1994 | Obigane |
| 4,929,893 A | 5/1990 | Sato et al. | 5,280,156 A | 1/1994 | Niori et al. |
| 4,933,634 A | 6/1990 | Cuzin et al. | 5,298,972 A | 3/1994 | Heffner |
| 4,968,931 A | 11/1990 | Littlebury et al. | 5,303,938 A | 4/1994 | Miller et al. |
| 4,978,907 A | 12/1990 | Smith | 5,304,924 A | 4/1994 | Yamano et al. |
| 4,978,914 A | 12/1990 | Akimoto et al. | 5,315,237 A | 5/1994 | Iwakura et al. |
| 4,982,153 A | 1/1991 | Collins et al. | 5,321,352 A | 6/1994 | Takebuchi |
| 4,994,737 A | 2/1991 | Carlton et al. | 5,321,453 A | 6/1994 | Mori et al. |
| 5,001,423 A | 3/1991 | Abrami et al. | 5,325,052 A | 6/1994 | Yamashita |
| 5,006,796 A | 4/1991 | Burton et al. | 5,334,931 A | 8/1994 | Clarke et al. |
| 5,010,296 A | 4/1991 | Okada et al. | 5,336,989 A | 8/1994 | Hofer |
| 5,019,692 A | 5/1991 | Nbedi et al. | 5,345,170 A | 9/1994 | Schwindt et al. |
| 5,030,907 A | 7/1991 | Yih et al. | 5,357,211 A | 10/1994 | Bryson et al. |
| 5,034,688 A | 7/1991 | Moulene et al. | 5,363,050 A | 11/1994 | Guo et al. |
| 5,041,782 A | 8/1991 | Marzan | 5,369,368 A | 11/1994 | Kassen et al. |
| 5,045,781 A | 9/1991 | Gleason et al. | 5,369,370 A | 11/1994 | Stratmann et al. |
| 5,061,823 A | 10/1991 | Carroll | 5,371,457 A | 12/1994 | Lipp |
| 5,065,089 A | 11/1991 | Rich | 5,373,231 A | 12/1994 | Boll et al. |
| 5,065,092 A | 11/1991 | Sigler | 5,374,938 A | 12/1994 | Hatazawa et al. |
| 5,066,357 A | 11/1991 | Smyth, Jr. et al. | 5,376,790 A | 12/1994 | Linker et al. |
| 5,070,297 A | 12/1991 | Kwon et al. | 5,382,898 A | 1/1995 | Subramanian |
| 5,077,523 A | 12/1991 | Blanz | 5,397,855 A | 3/1995 | Ferlier |
| 5,082,627 A | 1/1992 | Stanbro | 5,404,111 A | 4/1995 | Mori et al. |
| 5,084,671 A | 1/1992 | Miyata et al. | 5,408,188 A | 4/1995 | Katoh |
| 5,089,774 A | 2/1992 | Nakano | 5,408,189 A | 4/1995 | Swart et al. |
| 5,091,691 A | 2/1992 | Kamieniecki et al. | 5,410,259 A | 4/1995 | Fujihara et al. |
| 5,091,692 A | 2/1992 | Ohno et al. | 5,412,330 A | 5/1995 | Ravel et al. |
| 5,091,732 A | 2/1992 | Mileski et al. | 5,412,866 A | 5/1995 | Woith et al. |
| 5,095,891 A | 3/1992 | Reitter | 5,414,565 A | 5/1995 | Sullivan et al. |
| 5,097,207 A | 3/1992 | Blanz | 5,422,574 A | 6/1995 | Kister |
| 5,101,149 A | 3/1992 | Adams et al. | 5,434,512 A | 7/1995 | Schwindt et al. |
| 5,101,453 A | 3/1992 | Rumbaugh | 5,448,172 A | 9/1995 | Dechene et al. |
| 5,103,169 A | 4/1992 | Heaton et al. | 5,451,884 A | 9/1995 | Sauerland |
| 5,105,148 A | 4/1992 | Lee | 5,457,398 A | 10/1995 | Schwindt et al. |
| 5,105,181 A | 4/1992 | Ross | 5,461,328 A | 10/1995 | Devereaux et al. |
| 5,107,076 A | 4/1992 | Bullock et al. | 5,467,024 A | 11/1995 | Swapp |
| 5,136,237 A | 8/1992 | Smith et al. | 5,469,324 A | 11/1995 | Henderson et al. |
| 5,142,224 A | 8/1992 | Smith et al. | 5,475,316 A | 12/1995 | Hurley et al. |

| | | | | | | |
|---|---|---|---|---|---|---|
| 5,477,011 A | 12/1995 | Singles et al. | | 5,682,337 A | 10/1997 | El-Fishaway et al. |
| 5,478,748 A | 12/1995 | Akins, Jr. et al. | | 5,685,232 A | 11/1997 | Inoue |
| 5,479,108 A | 12/1995 | Cheng | | 5,704,355 A | 1/1998 | Bridges |
| 5,479,109 A | 12/1995 | Lau et al. | | 5,712,571 A | 1/1998 | O'Donoghue |
| 5,481,196 A | 1/1996 | Nosov | | 5,715,819 A | 2/1998 | Svenson et al. |
| 5,481,936 A | 1/1996 | Yanagisawa | | 5,729,150 A | 3/1998 | Schwindt |
| 5,486,975 A | 1/1996 | Shamouilian et al. | | 5,731,708 A | 3/1998 | Sobhani |
| 5,488,954 A | 2/1996 | Sleva et al. | | 5,731,920 A | 3/1998 | Katsuragawa |
| 5,491,426 A | 2/1996 | Small | | 5,744,971 A | 4/1998 | Chan et al. |
| 5,493,070 A | 2/1996 | Habu | | 5,748,506 A | 5/1998 | Bockelman |
| 5,493,236 A | 2/1996 | Ishii et al. | | 5,751,252 A | 5/1998 | Phillips |
| 5,500,606 A | 3/1996 | Holmes | | 5,767,690 A | 6/1998 | Fujimoto |
| 5,505,150 A | 4/1996 | James et al. | | 5,773,951 A | 6/1998 | Markowski et al. |
| 5,506,498 A | 4/1996 | Anderson et al. | | 5,777,485 A | 7/1998 | Tanaka et al. |
| 5,506,515 A | 4/1996 | Godshalk et al. | | 5,792,668 A | 8/1998 | Fuller et al. |
| 5,508,631 A | 4/1996 | Manku et al. | | 5,793,213 A | 8/1998 | Bockelman et al. |
| 5,510,792 A | 4/1996 | Ono et al. | | 5,794,133 A | 8/1998 | Kashima |
| 5,511,010 A | 4/1996 | Burns | | 5,798,652 A | 8/1998 | Taraci |
| 5,512,835 A | 4/1996 | Rivera et al. | | 5,802,856 A | 9/1998 | Schaper et al. |
| 5,515,167 A | 5/1996 | Ledger et al. | | 5,804,982 A | 9/1998 | Lo et al. |
| 5,517,111 A | 5/1996 | Shelor | | 5,804,983 A | 9/1998 | Nakajima et al. |
| 5,521,522 A | 5/1996 | Abe et al. | | 5,807,107 A | 9/1998 | Bright et al. |
| 5,523,694 A | 6/1996 | Cole, Jr. | | 5,811,751 A | 9/1998 | Leong et al. |
| 5,528,158 A | 6/1996 | Sinsheimer et al. | | 5,824,494 A | 10/1998 | Feldberg |
| 5,530,371 A | 6/1996 | Perry et al. | | 5,828,225 A | 10/1998 | Obikane et al. |
| 5,530,372 A | 6/1996 | Lee et al. | | 5,829,437 A | 11/1998 | Bridges |
| 5,532,609 A | 7/1996 | Harwood et al. | | 5,831,442 A | 11/1998 | Heigl |
| 5,539,323 A | 7/1996 | Davis, Jr. | | 5,833,601 A | 11/1998 | Swartz et al. |
| 5,539,676 A | 7/1996 | Yamaguchi | | 5,835,997 A | 11/1998 | Yassine |
| 5,546,012 A | 8/1996 | Perry et al. | | 5,838,161 A | 11/1998 | Akram et al. |
| 5,550,480 A | 8/1996 | Nelson et al. | | 5,841,288 A | 11/1998 | Meaney et al. |
| 5,550,482 A | 8/1996 | Sano | | 5,846,708 A | 12/1998 | Hollis et al. |
| 5,552,716 A | 9/1996 | Takahashi et al. | | 5,847,569 A | 12/1998 | Ho et al. |
| 5,561,377 A | 10/1996 | Strid et al. | | 5,848,500 A | 12/1998 | Kirk |
| 5,561,585 A | 10/1996 | Barnes et al. | | 5,852,232 A | 12/1998 | Samsavar et al. |
| 5,565,788 A | 10/1996 | Burr et al. | | 5,854,608 A | 12/1998 | Leisten |
| 5,565,881 A | 10/1996 | Phillips et al. | | 5,857,667 A | 1/1999 | Lee |
| 5,569,591 A | 10/1996 | Kell et al. | | 5,861,743 A | 1/1999 | Pye et al. |
| 5,571,324 A | 11/1996 | Sago et al. | | 5,867,073 A | 2/1999 | Weinreb et al. |
| 5,572,398 A | 11/1996 | Federlin et al. | | 5,869,326 A | 2/1999 | Hofmann |
| 5,578,932 A | 11/1996 | Adamian | | 5,869,975 A | 2/1999 | Strid et al. |
| 5,583,445 A | 12/1996 | Mullen | | 5,874,361 A | 2/1999 | Collins et al. |
| 5,584,608 A | 12/1996 | Gillespie | | 5,879,289 A | 3/1999 | Yarush et al. |
| 5,594,358 A | 1/1997 | Ishikawa et al. | | 5,883,522 A | 3/1999 | O'Boyle |
| 5,600,256 A | 2/1997 | Woith et al. | | 5,883,523 A | 3/1999 | Ferland et al. |
| 5,604,444 A | 2/1997 | Harwood et al. | | 5,888,075 A | 3/1999 | Hasegawa et al. |
| 5,610,529 A | 3/1997 | Schwindt | | 5,892,539 A | 4/1999 | Colvin |
| 5,611,946 A | 3/1997 | Leong et al. | | 5,900,737 A | 5/1999 | Graham et al. |
| 5,617,035 A | 4/1997 | Swapp | | 5,903,143 A | 5/1999 | Mochizuki et al. |
| 5,628,057 A | 5/1997 | Phillips et al. | | 5,905,421 A | 5/1999 | Oldfield |
| 5,629,631 A | 5/1997 | Perry et al. | | 5,910,727 A | 6/1999 | Fujihara et al. |
| 5,631,571 A | 5/1997 | Spaziani et al. | | 5,916,689 A | 6/1999 | Collins et al. |
| 5,633,780 A | 5/1997 | Cronin | | 5,923,177 A | 7/1999 | Wardwell |
| 5,640,101 A | 6/1997 | Kuji et al. | | 5,926,028 A | 7/1999 | Mochizuki |
| 5,642,298 A | 6/1997 | Mallory et al. | | 5,942,907 A | 8/1999 | Chiang |
| 5,644,248 A | 7/1997 | Fujimoto | | 5,944,093 A | 8/1999 | Viswanath |
| 5,646,538 A | 7/1997 | Lide et al. | | 5,945,836 A | 8/1999 | Sayre et al. |
| 5,653,939 A | 8/1997 | Hollis et al. | | 5,949,383 A | 9/1999 | Hayes et al. |
| 5,656,942 A | 8/1997 | Watts et al. | | 5,949,579 A | 9/1999 | Baker |
| 5,657,394 A | 8/1997 | Schwartz et al. | | 5,952,842 A | 9/1999 | Fujimoto |
| 5,659,255 A | 8/1997 | Strid et al. | | 5,959,461 A | 9/1999 | Brown et al. |
| 5,659,421 A | 8/1997 | Rahmel et al. | | 5,960,411 A | 9/1999 | Hartman et al. |
| 5,663,653 A | 9/1997 | Schwindt et al. | | 5,963,027 A | 10/1999 | Peters |
| 5,666,063 A | 9/1997 | Abercrombie et al. | | 5,963,364 A | 10/1999 | Leong et al. |
| 5,668,470 A | 9/1997 | Shelor | | 5,970,429 A | 10/1999 | Martin |
| 5,669,316 A | 9/1997 | Faz et al. | | 5,973,505 A | 10/1999 | Strid et al. |
| 5,670,322 A | 9/1997 | Eggers et al. | | 5,974,662 A | 11/1999 | Eldridge et al. |
| 5,670,888 A | 9/1997 | Cheng | | 5,981,268 A | 11/1999 | Kovacs et al. |
| 5,672,816 A | 9/1997 | Park et al. | | 5,982,166 A | 11/1999 | Mautz |
| 5,675,499 A | 10/1997 | Lee et al. | | 5,993,611 A | 11/1999 | Moroney, III et al. |
| 5,675,932 A | 10/1997 | Mauney | | 5,995,914 A | 11/1999 | Cabot |
| 5,676,360 A | 10/1997 | Boucher et al. | | 5,996,102 A | 11/1999 | Haulin |
| 5,680,039 A | 10/1997 | Mochizuki et al. | | 5,998,768 A | 12/1999 | Hunter et al. |

| | | | | | | |
|---|---|---|---|---|---|---|
| 5,999,268 A | 12/1999 | Yonezawa et al. | | 6,233,613 B1 | 5/2001 | Walker et al. |
| 6,001,760 A | 12/1999 | Katsuda et al. | | 6,236,223 B1 | 5/2001 | Brady et al. |
| 6,002,236 A | 12/1999 | Trant et al. | | 6,236,975 B1 | 5/2001 | Boe et al. |
| 6,002,263 A | 12/1999 | Peters et al. | | 6,236,977 B1 | 5/2001 | Verba et al. |
| 6,002,426 A | 12/1999 | Back et al. | | 6,242,929 B1 | 6/2001 | Mizuta |
| 6,013,586 A | 1/2000 | McGhee et al. | | 6,245,692 B1 | 6/2001 | Pearce et al. |
| 6,019,612 A | 2/2000 | Hasegawa et al. | | 6,251,595 B1 | 6/2001 | Gordon et al. |
| 6,023,209 A | 2/2000 | Faulkner et al. | | 6,252,392 B1 | 6/2001 | Peters |
| 6,028,435 A | 2/2000 | Nikawa | | 6,257,319 B1 | 7/2001 | Kainuma et al. |
| 6,029,141 A | 2/2000 | Bezos et al. | | 6,257,564 B1 | 7/2001 | Avneri et al. |
| 6,031,383 A | 2/2000 | Streib et al. | | 6,259,261 B1 | 7/2001 | Engelking et al. |
| 6,032,714 A | 3/2000 | Fenton | | 6,265,950 B1 | 7/2001 | Schmidt et al. |
| 6,034,533 A | 3/2000 | Tervo et al. | | 6,271,673 B1 | 8/2001 | Furuta et al. |
| 6,037,785 A | 3/2000 | Higgins | | 6,275,738 B1 | 8/2001 | Kasevich et al. |
| 6,037,793 A | 3/2000 | Miyazawa et al. | | 6,278,051 B1 | 8/2001 | Peabody |
| 6,043,667 A | 3/2000 | Cadwallader et al. | | 6,278,411 B1 | 8/2001 | Ohlsson et al. |
| 6,049,216 A | 4/2000 | Yang et al. | | 6,281,691 B1 | 8/2001 | Matsunaga et al. |
| 6,051,422 A | 4/2000 | Kovacs et al. | | 6,284,971 B1 | 9/2001 | Atalar et al. |
| 6,052,653 A | 4/2000 | Mazur et al. | | 6,288,557 B1 | 9/2001 | Peters et al. |
| 6,054,869 A | 4/2000 | Hutton et al. | | 6,292,760 B1 | 9/2001 | Burns |
| 6,060,888 A | 5/2000 | Blackham et al. | | 6,300,775 B1 | 10/2001 | Peach et al. |
| 6,060,891 A | 5/2000 | Hembree et al. | | 6,307,672 B1 | 10/2001 | DeNure |
| 6,060,892 A | 5/2000 | Yamagata | | 6,310,483 B1 | 10/2001 | Taura et al. |
| 6,061,589 A | 5/2000 | Bridges et al. | | 6,310,755 B1 | 10/2001 | Kholodenko et al. |
| 6,064,213 A | 5/2000 | Khandros et al. | | 6,313,649 B2 | 11/2001 | Harwood et al. |
| 6,064,217 A | 5/2000 | Smith | | 6,320,372 B1 | 11/2001 | Keller |
| 6,064,218 A | 5/2000 | Godfrey et al. | | 6,320,396 B1 | 11/2001 | Nikawa |
| 6,066,911 A | 5/2000 | Lindemann et al. | | 6,327,034 B1 | 12/2001 | Hoover et al. |
| 6,078,183 A | 6/2000 | Cole, Jr. | | 6,335,625 B1 | 1/2002 | Bryant et al. |
| 6,091,236 A | 7/2000 | Piety et al. | | 6,335,628 B2 | 1/2002 | Schwindt et al. |
| 6,091,255 A | 7/2000 | Godfrey | | 6,340,568 B2 | 1/2002 | Hefti |
| 6,096,567 A | 8/2000 | Kaplan et al. | | 6,340,895 B1 | 1/2002 | Uher et al. |
| 6,100,815 A | 8/2000 | Pailthorp | | 6,359,456 B1 | 3/2002 | Hembree et al. |
| 6,104,203 A | 8/2000 | Costello et al. | | 6,362,636 B1 | 3/2002 | Peters et al. |
| 6,104,206 A | 8/2000 | Verkuil | | 6,362,792 B1 | 3/2002 | Sawamura et al. |
| 6,111,419 A | 8/2000 | Lefever et al. | | 6,366,247 B1 | 4/2002 | Sawamura et al. |
| 6,114,865 A | 9/2000 | Lagowski et al. | | 6,369,776 B1 | 4/2002 | Leisten et al. |
| 6,118,287 A | 9/2000 | Boll et al. | | 6,376,258 B2 | 4/2002 | Hefti |
| 6,118,894 A | 9/2000 | Schwartz et al. | | 6,380,751 B2 | 4/2002 | Harwood et al. |
| 6,121,783 A | 9/2000 | Horner et al. | | 6,384,614 B1 | 5/2002 | Hager et al. |
| 6,124,723 A | 9/2000 | Costello | | 6,395,480 B1 | 5/2002 | Hefti |
| 6,124,725 A | 9/2000 | Sato | | 6,396,296 B1 | 5/2002 | Tarter et al. |
| 6,127,831 A | 10/2000 | Khoury et al. | | 6,396,298 B1 | 5/2002 | Young et al. |
| 6,130,544 A | 10/2000 | Strid et al. | | 6,400,168 B2 | 6/2002 | Matsunaga et al. |
| 6,137,302 A | 10/2000 | Schwindt | | 6,404,213 B2 | 6/2002 | Noda |
| 6,137,303 A | 10/2000 | Deckert et al. | | 6,407,560 B1 * | 6/2002 | Walraven et al. ............ 324/752 |
| 6,144,212 A | 11/2000 | Mizuta | | 6,407,562 B1 | 6/2002 | Whiteman |
| 6,147,502 A | 11/2000 | Fryer et al. | | 6,409,724 B1 | 6/2002 | Penny et al. |
| 6,147,851 A | 11/2000 | Anderson | | 6,414,478 B1 | 7/2002 | Suzuki |
| 6,160,407 A | 12/2000 | Nikawa | | 6,415,858 B1 | 7/2002 | Getchel et al. |
| 6,166,553 A | 12/2000 | Sinsheimer | | 6,418,009 B1 | 7/2002 | Brunette |
| 6,169,410 B1 | 1/2001 | Grace et al. | | 6,420,722 B2 | 7/2002 | Moore et al. |
| 6,172,337 B1 | 1/2001 | Johnsgard et al. | | 6,424,141 B1 | 7/2002 | Hollman et al. |
| 6,175,228 B1 | 1/2001 | Zamborelli et al. | | 6,424,316 B1 | 7/2002 | Leisten |
| 6,181,144 B1 | 1/2001 | Hembree et al. | | 6,445,202 B1 | 9/2002 | Cowan et al. |
| 6,181,149 B1 | 1/2001 | Godfrey et al. | | 6,447,339 B1 | 9/2002 | Reed et al. |
| 6,181,297 B1 | 1/2001 | Leisten | | 6,448,788 B1 | 9/2002 | Meaney et al. |
| 6,181,416 B1 | 1/2001 | Falk | | 6,459,739 B1 | 10/2002 | Vitenberg |
| 6,184,845 B1 | 2/2001 | Leisten et al. | | 6,476,442 B1 | 11/2002 | Williams et al. |
| 6,191,596 B1 | 2/2001 | Abiko | | 6,480,013 B1 | 11/2002 | Nayler et al. |
| 6,194,720 B1 | 2/2001 | Li et al. | | 6,481,939 B1 | 11/2002 | Gillespie et al. |
| 6,194,907 B1 | 2/2001 | Kanao et al. | | 6,483,327 B1 | 11/2002 | Bruce et al. |
| 6,198,299 B1 | 3/2001 | Hollman | | 6,483,336 B1 | 11/2002 | Harris et al. |
| 6,211,663 B1 | 4/2001 | Moulthrop et al. | | 6,486,687 B2 | 11/2002 | Harwood et al. |
| 6,211,837 B1 | 4/2001 | Crouch et al. | | 6,488,405 B2 | 12/2002 | Eppes et al. |
| 6,215,295 B1 | 4/2001 | Smith, III | | 6,489,789 B2 | 12/2002 | Peters et al. |
| 6,222,031 B1 | 4/2001 | Wakabayashi et al. | | 6,490,471 B2 | 12/2002 | Svenson et al. |
| 6,222,970 B1 | 4/2001 | Wach et al. | | 6,492,822 B2 | 12/2002 | Schwindt et al. |
| 6,229,327 B1 | 5/2001 | Boll et al. | | 6,501,289 B1 | 12/2002 | Takekoshi |
| 6,232,787 B1 | 5/2001 | Lo et al. | | 6,512,482 B1 | 1/2003 | Nelson et al. |
| 6,232,788 B1 | 5/2001 | Schwindt et al. | | 6,515,494 B1 | 2/2003 | Low |
| 6,232,789 B1 | 5/2001 | Schwindt | | 6,528,993 B1 | 3/2003 | Shin et al. |
| 6,232,790 B1 | 5/2001 | Bryan et al. | | 6,529,844 B1 | 3/2003 | Kapetanic et al. |

| | | | | | | |
|---|---|---|---|---|---|---|
| 6,548,311 | B1 | 4/2003 | Knoll | 6,873,167 B2 | 3/2005 | Goto et al. |
| 6,549,022 | B1 | 4/2003 | Cole, Jr. et al. | 6,885,197 B2 | 4/2005 | Harris et al. |
| 6,549,026 | B1 | 4/2003 | Dibattista et al. | 6,900,646 B2 | 5/2005 | Kasukabe et al. |
| 6,549,106 | B2 | 4/2003 | Martin | 6,900,647 B2 | 5/2005 | Yoshida et al. |
| 6,566,079 | B2 | 5/2003 | Hefti | 6,900,652 B2 | 5/2005 | Mazur |
| 6,573,702 | B2 | 6/2003 | Marcuse et al. | 6,900,653 B2 | 5/2005 | Yu et al. |
| 6,578,264 | B1 | 6/2003 | Gleason et al. | 6,902,941 B2 | 6/2005 | Sun |
| 6,580,283 | B1 | 6/2003 | Carbone et al. | 6,903,563 B2 | 6/2005 | Yoshida et al. |
| 6,582,979 | B2 | 6/2003 | Coccioli et al. | 6,914,244 B2 | 7/2005 | Alani |
| 6,587,327 | B1 | 7/2003 | Devoe et al. | 6,914,580 B2 | 7/2005 | Leisten |
| 6,603,322 | B1 | 8/2003 | Boll et al. | 6,927,079 B1 | 8/2005 | Fyfield |
| 6,605,951 | B1 | 8/2003 | Cowan | 6,937,341 B1 | 8/2005 | Woollam et al. |
| 6,605,955 | B1 | 8/2003 | Costello et al. | 6,970,001 B2 | 11/2005 | Chheda et al. |
| 6,608,494 | B1 | 8/2003 | Bruce et al. | 6,987,483 B2 | 1/2006 | Tran |
| 6,608,496 | B1 | 8/2003 | Strid et al. | 7,001,785 B1 | 2/2006 | Chen |
| 6,611,417 | B2 | 8/2003 | Chen | 7,002,133 B2 | 2/2006 | Beausoleil et al. |
| 6,617,862 | B1 | 9/2003 | Bruce | 7,002,363 B2 | 2/2006 | Mathieu |
| 6,621,082 | B2 | 9/2003 | Morita et al. | 7,002,364 B2 | 2/2006 | Kang et al. |
| 6,624,891 | B2 | 9/2003 | Marcus et al. | 7,003,184 B2 | 2/2006 | Ronnekleiv et al. |
| 6,627,461 | B2 | 9/2003 | Chapman et al. | 7,005,842 B2 | 2/2006 | Fink et al. |
| 6,628,503 | B2 | 9/2003 | Sogard | 7,005,868 B2 | 2/2006 | McTigue |
| 6,628,980 | B2 | 9/2003 | Atalar et al. | 7,005,879 B1 | 2/2006 | Robertazzi |
| 6,633,174 | B1 | 10/2003 | Satya et al. | 7,006,046 B2 | 2/2006 | Aisenbrey |
| 6,636,059 | B2 | 10/2003 | Harwood et al. | 7,007,380 B2 | 3/2006 | Das et al. |
| 6,636,182 | B2 | 10/2003 | Mehltretter | 7,009,188 B2 | 3/2006 | Wang |
| 6,639,415 | B2 | 10/2003 | Peters et al. | 7,009,383 B2 | 3/2006 | Harwood et al. |
| 6,639,461 | B1 | 10/2003 | Tam et al. | 7,009,415 B2 | 3/2006 | Kobayashi et al. |
| 6,642,732 | B2 | 11/2003 | Cowan et al. | 7,011,531 B2 | 3/2006 | Egitto et al. |
| 6,643,597 | B1 | 11/2003 | Dunsmore | 7,012,425 B2 | 3/2006 | Shoji |
| 6,653,903 | B2 | 11/2003 | Leich et al. | 7,012,441 B2 | 3/2006 | Chou et al. |
| 6,657,601 | B2 | 12/2003 | McLean | 7,013,221 B1 | 3/2006 | Friend et al. |
| 6,686,753 | B1 | 2/2004 | Kitahata | 7,014,499 B2 | 3/2006 | Yoon |
| 6,701,265 | B2 | 3/2004 | Hill et al. | 7,015,455 B2 | 3/2006 | Mitsuoka et al. |
| 6,707,548 | B2 | 3/2004 | Kreimer et al. | 7,015,689 B2 | 3/2006 | Kasajima et al. |
| 6,710,798 | B1 | 3/2004 | Hershel et al. | 7,015,690 B2 | 3/2006 | Wang et al. |
| 6,717,426 | B2 | 4/2004 | Iwasaki | 7,015,703 B2 | 3/2006 | Hopkins et al. |
| 6,720,782 | B2 | 4/2004 | Schwindt et al. | 7,015,707 B2 | 3/2006 | Cherian |
| 6,724,205 | B1 | 4/2004 | Hayden et al. | 7,015,708 B2 | 3/2006 | Beckous et al. |
| 6,724,928 | B1 | 4/2004 | Davis | 7,015,709 B2 | 3/2006 | Capps et al. |
| 6,727,716 | B1 | 4/2004 | Sharif | 7,015,710 B2 | 3/2006 | Yoshida et al. |
| 6,731,804 | B1 | 5/2004 | Carrieri et al. | 7,015,711 B2 | 3/2006 | Rothaug et al. |
| 6,734,687 | B1 | 5/2004 | Ishitani et al. | 7,019,541 B2 | 3/2006 | Kittrell |
| 6,737,920 | B2 | 5/2004 | Jen et al. | 7,019,544 B1 | 3/2006 | Jacobs et al. |
| 6,744,268 | B2 | 6/2004 | Hollman | 7,019,701 B2 | 3/2006 | Ohno et al. |
| 6,753,679 | B1 | 6/2004 | Kwong et al. | 7,020,360 B2 | 3/2006 | Satomura et al. |
| 6,753,699 | B2 | 6/2004 | Stockstad | 7,020,363 B2 | 3/2006 | Johannessen |
| 6,768,328 | B2 | 7/2004 | Self et al. | 7,022,976 B1 | 4/2006 | Santana, Jr. et al. |
| 6,770,955 | B1 | 8/2004 | Coccioli et al. | 7,022,985 B2 | 4/2006 | Knebel et al. |
| 6,771,090 | B2 | 8/2004 | Harris et al. | 7,023,225 B2 | 4/2006 | Blackwood |
| 6,771,806 | B1 | 8/2004 | Satya et al. | 7,023,226 B2 | 4/2006 | Okumura et al. |
| 6,774,651 | B1 | 8/2004 | Hembree | 7,023,229 B2 * | 4/2006 | Maesaki et al. ............ 324/760 |
| 6,777,964 | B2 | 8/2004 | Navratil et al. | 7,023,231 B2 | 4/2006 | Howland, Jr. et al. |
| 6,778,140 | B1 | 8/2004 | Yeh | 7,025,628 B2 | 4/2006 | LaMeres et al. |
| 6,784,679 | B2 | 8/2004 | Sweet et al. | 7,026,832 B2 | 4/2006 | Chaya et al. |
| 6,788,093 | B2 | 9/2004 | Aitren et al. | 7,026,833 B2 | 4/2006 | Rincon et al. |
| 6,791,344 | B2 | 9/2004 | Cook et al. | 7,026,834 B2 | 4/2006 | Hwang |
| 6,794,888 | B2 | 9/2004 | Kawaguchi et al. | 7,026,835 B2 | 4/2006 | Farnworth et al. |
| 6,794,950 | B2 | 9/2004 | Du Toit et al. | 7,030,599 B2 | 4/2006 | Douglas |
| 6,798,226 | B2 | 9/2004 | Altmann et al. | 7,030,827 B2 | 4/2006 | Mahler et al. |
| 6,801,047 | B2 | 10/2004 | Harwood et al. | 7,032,307 B2 | 4/2006 | Matsunaga et al. |
| 6,806,724 | B2 | 10/2004 | Hayden et al. | 7,034,553 B2 | 4/2006 | Gilboe |
| 6,806,836 | B2 | 10/2004 | Ogawa et al. | 7,035,738 B2 | 4/2006 | Matsumoto et al. |
| 6,809,533 | B1 | 10/2004 | Anlage et al. | 7,088,981 B2 | 8/2006 | Chang |
| 6,812,718 | B1 | 11/2004 | Chong et al. | 7,096,133 B1 | 8/2006 | Martin et al. |
| 6,822,463 | B1 | 11/2004 | Jacobs | 7,101,797 B2 * | 9/2006 | Yuasa ........................ 438/689 |
| 6,836,135 | B2 | 12/2004 | Harris et al. | 7,187,188 B2 | 3/2007 | Andrews et al. |
| 6,838,885 | B2 | 1/2005 | Kamitani | 7,188,037 B2 | 3/2007 | Hidehira |
| 6,842,024 | B2 | 1/2005 | Peters et al. | 2001/0002794 A1 | 6/2001 | Draving et al. |
| 6,843,024 | B2 | 1/2005 | Nozaki et al. | 2001/0009377 A1 | 7/2001 | Schwindt et al. |
| 6,847,219 | B1 | 1/2005 | Lesher et al. | 2001/0010468 A1 | 8/2001 | Gleason et al. |
| 6,856,129 | B2 | 2/2005 | Thomas et al. | 2001/0020283 A1 | 9/2001 | Sakaguchi |
| 6,861,856 | B2 | 3/2005 | Dunklee et al. | 2001/0024116 A1 | 9/2001 | Draving |
| 6,864,694 | B2 | 3/2005 | McTigue | 2001/0030549 A1 | 10/2001 | Gleason et al. |

| | | |
|---|---|---|
| 2001/0043073 A1 | 11/2001 | Montoya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0050828 A1 | 5/2002 | Seward, IV et al. |
| 2002/0070743 A1 | 6/2002 | Felici et al. |
| 2002/0070745 A1 | 6/2002 | Johnson et al. |
| 2002/0075027 A1 | 6/2002 | Hollman et al. |
| 2002/0079911 A1 | 6/2002 | Schwindt |
| 2002/0118009 A1 | 8/2002 | Hollman et al. |
| 2002/0118034 A1 | 8/2002 | Laureanti |
| 2002/0149377 A1 | 10/2002 | Hefti et al. |
| 2002/0153909 A1 | 10/2002 | Peterson et al. |
| 2002/0163769 A1 | 11/2002 | Brown |
| 2002/0168659 A1 | 11/2002 | Hefti et al. |
| 2002/0180466 A1 | 12/2002 | Hiramatsu et al. |
| 2002/0197709 A1 | 12/2002 | Van der Welde et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Alexander |
| 2003/0062915 A1 | 4/2003 | Arnold et al. |
| 2003/0071631 A1 | 4/2003 | Alexander |
| 2003/0072549 A1 | 4/2003 | Facer et al. |
| 2003/0077649 A1 | 4/2003 | Cho et al. |
| 2003/0088180 A1 | 5/2003 | VanVeen et al. |
| 2003/0119057 A1 | 6/2003 | Gascoyne et al. |
| 2003/0139662 A1 | 7/2003 | Seidman |
| 2003/0139790 A1 | 7/2003 | Ingle et al. |
| 2003/0141861 A1 | 7/2003 | Navratil et al. |
| 2003/0155939 A1 | 8/2003 | Lutz et al. |
| 2003/0170898 A1 | 9/2003 | Gunderson et al. |
| 2003/0184332 A1 | 10/2003 | Tominatsu et al. |
| 2004/0015060 A1 | 1/2004 | Samsoondar et al. |
| 2004/0021475 A1 | 2/2004 | Ito et al. |
| 2004/0061514 A1 | 4/2004 | Schwindt et al. |
| 2004/0066181 A1 | 4/2004 | Thies |
| 2004/0069776 A1 | 4/2004 | Fagrell et al. |
| 2004/0090223 A1 | 5/2004 | Yonezawa |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0108847 A1 | 6/2004 | Stoll et al. |
| 2004/0113639 A1 | 6/2004 | Dnuklee et al. |
| 2004/0113640 A1 | 6/2004 | Cooper et al. |
| 2004/0130787 A1 | 7/2004 | Thome-Forster et al. |
| 2004/0132222 A1 | 7/2004 | Hembree et al. |
| 2004/0134899 A1 | 7/2004 | Hiramatsu et al. |
| 2004/0147034 A1 | 7/2004 | Gore et al. |
| 2004/0162689 A1 | 8/2004 | Jamneala et al. |
| 2004/0175294 A1 | 9/2004 | Ellison et al. |
| 2004/0186382 A1 | 9/2004 | Modell et al. |
| 2004/0193382 A1 | 9/2004 | Adamian et al. |
| 2004/0197771 A1 | 10/2004 | Powers et al. |
| 2004/0199350 A1 | 10/2004 | Blackham et al. |
| 2004/0207072 A1 | 10/2004 | Hiramatsu et al. |
| 2004/0207424 A1 | 10/2004 | Hollman |
| 2004/0239338 A1 | 12/2004 | Johnsson et al. |
| 2004/0246004 A1 | 12/2004 | Heuermann |
| 2004/0251922 A1 | 12/2004 | Martens et al. |
| 2005/0024069 A1 | 2/2005 | Hayden et al. |
| 2005/0026276 A1 | 2/2005 | Chou |
| 2005/0030047 A1 | 2/2005 | Adamlan |
| 2005/0054029 A1 | 3/2005 | Tomimatsu et al. |
| 2005/0062533 A1 | 3/2005 | Vice |
| 2005/0083130 A1 | 4/2005 | Grilo |
| 2005/0099192 A1 | 5/2005 | Dunklee et al. |
| 2005/0101846 A1 | 5/2005 | Fine et al. |
| 2005/0156675 A1 | 7/2005 | Rohde et al. |
| 2005/0164160 A1 | 7/2005 | Gunter et al. |
| 2005/0165316 A1 | 7/2005 | Lowery et al. |
| 2005/0168722 A1 | 8/2005 | Forstner et al. |
| 2005/0174191 A1 | 8/2005 | Brunker et al. |
| 2005/0178980 A1 | 8/2005 | Skidmore et al. |
| 2005/0195124 A1 | 9/2005 | Puente Baliarda et al. |
| 2005/0227503 A1 | 10/2005 | Reitinger |
| 2005/0236587 A1 | 10/2005 | Kodama et al. |
| 2005/0237102 A1 | 10/2005 | Tanaka |
| 2006/0052075 A1 | 3/2006 | Galivanche et al. |
| 2006/0114012 A1 | 6/2006 | Reitinger |
| 2006/0155270 A1 | 7/2006 | Hancock et al. |
| 2006/0158207 A1 | 7/2006 | Reitinger |
| 2006/0226864 A1 | 10/2006 | Kramer |
| 2007/0024506 A1 | 2/2007 | Hardacker |
| 2007/0030021 A1 | 2/2007 | Cowan et al. |

FOREIGN PATENT DOCUMENTS

| | | |
|---|---|---|
| DE | 31 14 466 | 3/1982 |
| DE | 31 25 552 | 11/1982 |
| DE | 3637549 | 5/1988 |
| DE | 41 09 908 | 10/1992 |
| DE | 43 16 111 | 11/1994 |
| DE | 195 41 334 | 9/1996 |
| DE | 196 16 212 | 10/1996 |
| DE | 19522774 | 1/1997 |
| DE | 196 18 717 | 1/1998 |
| DE | 10000324 | 7/2001 |
| EP | 0 087 497 | 9/1983 |
| EP | 0 201 205 | 12/1986 |
| EP | 0 314 481 | 5/1989 |
| EP | 0 333 521 | 9/1989 |
| EP | 0 460 911 | 12/1991 |
| EP | 0 574 149 A1 | 5/1993 |
| EP | 0 574 149 | 12/1993 |
| EP | 0 706 210 | 4/1996 |
| EP | 0 573 183 | 1/1999 |
| EP | 0 945 736 | 9/1999 |
| GB | 2 197 081 | 5/1988 |
| JP | 53-037077 | 4/1978 |
| JP | 53052354 | 5/1978 |
| JP | 55-115383 | 9/1980 |
| JP | 56007439 | 1/1981 |
| JP | 56-88333 | 7/1981 |
| JP | 57-075480 | 5/1982 |
| JP | 57-163035 | 10/1982 |
| JP | 8-261898 | 10/1986 |
| JP | 62-011243 | 1/1987 |
| JP | 62-11243 | 1/1987 |
| JP | 62-51235 | 3/1987 |
| JP | 62-098634 | 5/1987 |
| JP | 62-107937 | 5/1987 |
| JP | 62-239050 | 10/1987 |
| JP | 63-108736 | 5/1988 |
| JP | 63-129640 | 6/1988 |
| JP | 63143814 | 6/1988 |
| JP | 63-160355 | 7/1988 |
| JP | 63-318745 | 12/1988 |
| JP | 1-165968 | 6/1989 |
| JP | 1-178872 | 7/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22836 | 1/1990 |
| JP | 2-22837 | 1/1990 |
| JP | 2-22873 | 1/1990 |
| JP | 2-124469 | 5/1990 |

| | | |
|---|---|---|
| JP | 2-191352 | 7/1990 |
| JP | 2-220453 | 9/1990 |
| JP | 3-67187 | 3/1991 |
| JP | 3-175367 | 7/1991 |
| JP | 3-196206 | 8/1991 |
| JP | 3-228348 | 10/1991 |
| JP | 4-130639 | 5/1992 |
| JP | 4-159043 | 6/1992 |
| JP | 4-206930 | 7/1992 |
| JP | 4-340248 | 11/1992 |
| JP | 50-82631 | 4/1993 |
| JP | 5-157790 | 6/1993 |
| JP | 51-57790 | 6/1993 |
| JP | 5-166893 | 7/1993 |
| JP | 6-85044 | 3/1994 |
| JP | 6071425 | 3/1994 |
| JP | 6-102313 | 4/1994 |
| JP | 6-132709 | 5/1994 |
| JP | 7-5197 | 1/1995 |
| JP | 7-12871 | 1/1995 |
| JP | 7005078 | 1/1995 |
| JP | 7-273509 | 10/1995 |
| JP | 8-35987 | 2/1996 |
| JP | 8-330401 | 12/1996 |
| JP | 10-116866 | 5/1998 |
| JP | 10-339743 | 12/1998 |
| JP | 11-023975 | 1/1999 |
| JP | 11-031724 | 2/1999 |
| JP | 2000-329664 | 11/2000 |
| JP | 2001-124676 | 5/2001 |
| JP | 2001 189378 | 7/2001 |
| JP | 2001 189585 | 7/2001 |
| JP | 2002033374 | 1/2002 |
| JP | 2002/164396 | 6/2002 |
| JP | 2002-164396 | 6/2002 |
| JP | 2002-203879 | 7/2002 |
| JP | 2002-243502 | 8/2002 |
| SU | 843040 | 6/1981 |
| SU | 1392603 | 4/1988 |
| WO | WO 80/00101 | 1/1980 |
| WO | WO 86/07493 | 12/1986 |
| WO | WO 89/04001 | 5/1989 |
| WO | WO 0169656 | 9/2001 |
| WO | WO 2004/049395 | 6/2004 |
| WO | WO 2004/065944 | 8/2004 |
| WO | WO 2004/079299 | 9/2004 |
| WO | WO 2005/062025 | 7/2005 |

OTHER PUBLICATIONS

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.
Cascade Microtech, "Introducing the peak of analytical probe stations," MicroProbe Update, May 1990.
H.-J. Eul and B. Schiek, "Thru-Match-Reflect: One Result of a Rigorous Theory for De-Embedding and Network Analyzer Calibration," 18th European Microwave Conference '88, The International Conference Designed for the Microwave Community, Published by Microwave Exhibitions and Publishers Limited, Sep. 12-16, 1988, Stockholm, Sweden.
Cascade Microtech, "Analytical Probe Station," Summit 9000 Series, Jun. 1, 1990.
Maury Microwave Corporation, "MT950D Series, Transistor Test Fixture Software, Software Application Packs," Sep. 1982.
Eric Phizicky, Philippe I.H. Bastiaens, Heng Zhu, Michael Snyder, & Stanley Fields, "Protein analysis on a proteomic scale," Nature 422, insight; review article, Mar. 13, 2003.
Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.

Eric Strid (Cascade Microtech), "Planar Impedance Standards and Accuracy Considerations in Vector Network Analysis," Jun. 1986, 8 pages.
Maury Microwave Corporation, "MT950 Series Transistor Test Fixture (TTF) Notice! Notice! Notice!," May 31, 1985.
Maury Microwave Corporation, MT950 Series Transistor Text Fixture (TTF), Oct. 7, 1982, 4 pages.
Design Technique, "Microstrip Microwave Test Fixture," May 1986, 2 pages.
PHOTO: Micromanipulator Probe Station 1994.
Micromanipulator Sales and Services Inc., "Test Station Accessories," Copyright 1983, 1984, 1 page.
Ruedi Aebersold & Matthias Mann, "Insight Review Articles, Mass spectrometry-based proteomics," Nature, vol. 422, Mar. 13, 2003, pp. 198-207.
Keithley Instruments, Inc. "Low-Level Measurements for Effective Low Current, Low Voltage, and High Impedance Measurements," Revised Third Edition, Printed Jun. 1984.
Hewlett Packard, "HP 4284A Precision LCR Meter Operation Manual (Including Option 001,002,006,201,202,301)," Third Edition, Dec. 1991, pp. 2-1, 6-9, 6-15.
Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.
Cascade Microtech Technical Brief, A Guide to Better Vector Network Analyzer Calibrations for Probe-Tip Measurements, Copyright 1994, 2 pages.
TEMPTRONIC, "Guarded" Chuck Sketch, Nov. 15, 1989.
Andrej Sali, Robert Glaeser, Thomas Earnet & Wolfgang Baumeister, "From works to liteature in structural proteomics," Insight: Review Article, Nature 422, pp. 216-225, Mar. 13, 2003.
Mike Tyers & Matthias Mann, "From genomics to proteomics," Insight overview, Nature vol. 422, Mar. 2003, pp. 193-197.
William Knauer, "Fixturing for Low-Current/Low-Voltage Parametric Testing," Evaluation Engineering, Nov. 1990, pp. 9-12.
J.D.Tompkins, "Evaluating High Speed AC Testers," IBM Technical Disclosure Bulletin, vol. 13, No. 7 Dec. 1970, p. 180.
Jim Fitzpatrick, "Error Models for Systems Measurement," Microwave Journal, May 1978, pp. 63-66.
Sam Hanash, "Disease proteomics," Insight Review Articles, Nature, vol. 422, Mar. 13, 2003, pp. 226-232.
Design Technique International, "Adjustable Test Fixture," Copyright 1988.
Ronald F. Bauer & Paul Penfield, Jr., "De-Embedding and Unterminating," IEEE Transactions on Microwave Theory and Techniques, vol. MTT-22, No. 3, Mar. 1974, pp. 282-288.
Cross Section—Signatone S-1240 Sketch, Advertised & Sold 1987-1988.
Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.
R. Y. Koyama & M. G. Buehler, "Semiconductor Measurement Technology: A Wafer Chuck for Use Between—196 and 350° C."
U.S. Department of Commerce, National Technical Information Service, PB-293 298, Issued Jan. 1979.
Ken Cole, "ThermoChuck Performance (Fax)," 2 pages, Mar. 10, 1995.
S. Beck & E. Tomann, "Chip Tester," IBM Technical Disclosure Bulletin, Jan. 1985.
L. L. Sohn, O. A. Saleh, G. R. Facer, A. J. Beavis, R. S. Allan, & D. A. Notterman, "Capacitance Cytometry: Measuring biological cells one by one," PNAS vol. 97, No. 20 Sep. 26, 2000, pp. 10687-10690.
Mark S. Boguski & Martin W. McIntosh, "Biomedical Informatics for proteomics," Insight: review article, Nature 422, Mar. 13, 2003, pp. 233-237.
The Micromanipulator Company, Inc., "Model 8000 Test Station," 1986, 1 page.
The Micromanipulator Company, Inc. "Model 8000 Test Station," 1988, 1 page.
Microwave Products, Microwave Journal, Sep. 1988, 1 page.

Saswata Basu & Leonard Hayden, "An SOLR Calibration for Accurate Measurement of Orthogonal On-Wafer Duts," IEEE MTT-S Digest, 1997, pp. 1335-1336, 1338.

Hewlett Packard, "HP 4142B Modular DE source/Monitor Practical Applications—High Speed DC Characterization of Semiconductor Devices from Sub pA to 1A," Nov. 1987, pp. 1-4.

Flexion Corporation, "Cryotest Station MP-3," *Cascade Microtech, Inc. vs. Micromanipulator Company, Inc.*, Applebay Exhibit 576, May 13, 1998, 68 pages.

Flexion Corporation, "Cryotest Station MP-3," *Cascade Microtech, Inc. vs. Micromanipulator Company, Inc.*, Applebay Exhibit 578, May 13, 1998, 1 page.

*Cascade Microtech, Inc. vs. Micromanipulator Company, Inc.*, Applebay Exhibit 572, May 13, 1998, 2 pages.

*Cascade Microtech, Inc., vs. Micromanipulator Company, Inc.*, Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

*Cascade Microtech, Inc. vs. Micromanipulator Company, Inc.*, Applebay Exhibits 577A, 577B, 577C, May 13, 1998, 3 pages.

*Cascade Microtech, Inc. vs. Micromanipulator Company, Inc.*, Applebay Exhibit 585, May 13, 1998, 7 pages.

Sam Hanash, "insight review articles, Disease proteomics," Nature, vol. 422, Mar. 13, 2003, pp. 226-232.

Barbara Matre, Senior Editor, "Nature insight Proteomics," Nature vol. 422, Mar. 13, 2003 pp. 191-194.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analysis," IEEE Transactions on Instrumentation and Measurement, vol. 50, No. 5, Oct. 2001, pp. 1307-1313.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Institute of Physics, pp. 1354-1358.

Cascade Microtech, "Probe Heads Care and cleaning of coaxial input microwave probes," Microwave Probe Care and Cleaning, Instruction Manual, Copyright 1990.

* cited by examiner

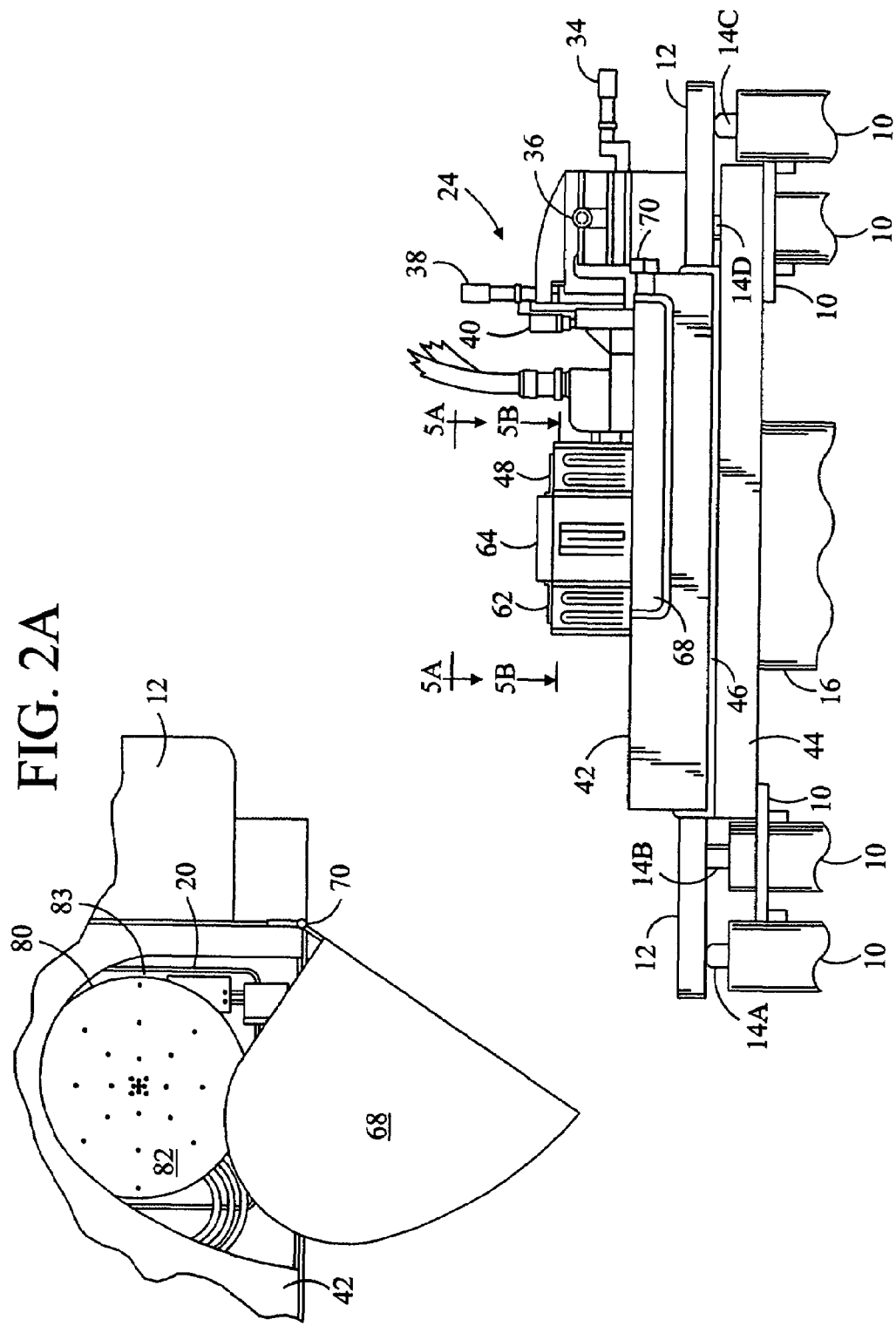

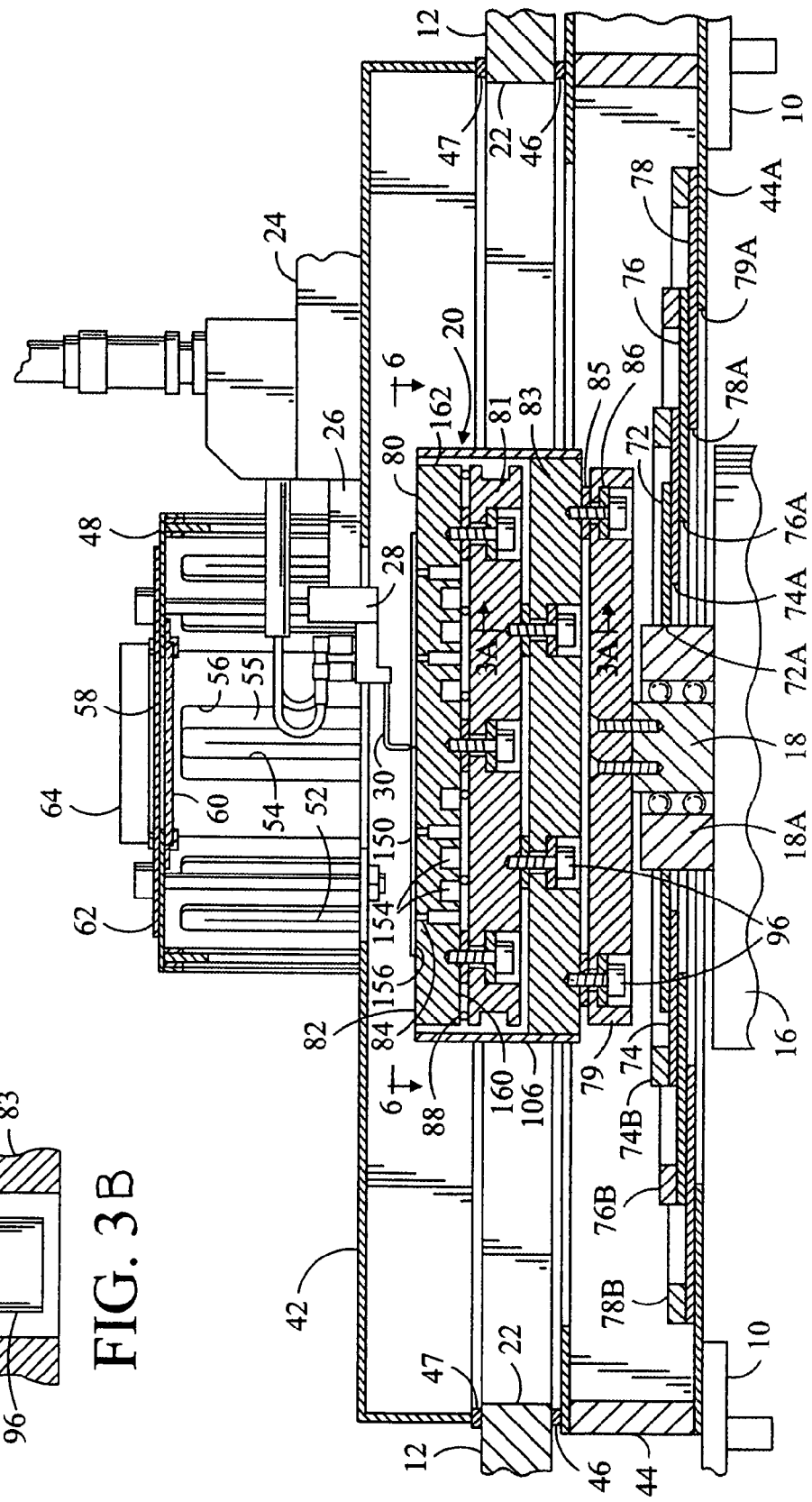
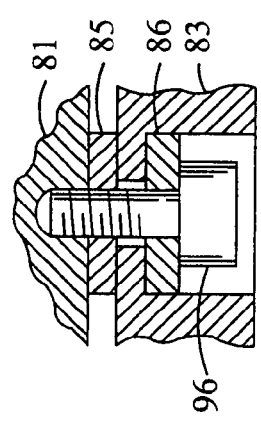

LOCALIZING A TEMPERATURE OF A DEVICE FOR TESTING

CROSS-REFERENCE TO RELATED APPLICATIONS

This application claims the benefit of U.S. Provisional Application No. 60/579,751, filed Jun. 14, 2004.

BACKGROUND OF THE INVENTION

The present invention relates to probe stations adapted for measuring the performance of integrated circuits and other devices under varying temperature conditions.

Integrated circuits (ICs) are manufactured on semiconductor wafers that can include many individual devices or electronic circuits, known as dies. Individual dies are electrically tested with probes that are connected to test instruments and brought into contact with test pads on the die. This typically occurs at a probe station which includes a stage supporting a wafer chuck having a top surface on which a wafer can be restrained during probing. Typically, a vacuum system is connected to the chuck and selectively connectable through passages or tubes, internal to the chuck, to several openings in the top surface of the chuck. A wafer, resting on the top surface of the chuck and covering the openings, is secured by air pressure when a vacuum source is connected to the openings. The stage supporting the chuck is generally movable to position the wafer under one or more probes that can be brought into contact the test pads on the wafer. The test instrumentation applies predetermined electrical excitation through the probes to certain test points and senses the response of the respective circuit or device to the excitation.

Measuring performance under variable temperature conditions is a substantial component of IC performance testing. An IC may be tested at elevated or depressed temperatures to determine the potential effect on performance of operating the IC at its limits or using or storing an electronic device incorporating the IC in various environments. Typically, a thermal chuck is used to heat or cool the wafer in preparation for probe testing at a non-ambient temperature. The top surface of a thermal chuck typically comprises a thermal plate which is usually cast or fabricated from aluminum, another metal, or a non-metal that exhibits good thermal conductivity and dimensional stability over the range of temperatures at which testing will be performed. The simplest form of thermal chuck incorporates a heater element that heats the surface of the thermal plate supporting the wafer. Heaters can take several forms, such as plate heaters, coil heaters, mica heaters, thin film heaters, or heater rods incorporated into the chuck or cast into the chuck's structure. To cool the wafer to a temperature below the ambient temperature, a thermal chuck may also include passageways for the circulation of a cooled liquid or gas. On the other hand, thermal chucks may incorporate thermoelectric devices that can alternately heat or cool the wafer. The thermoelectric devices are based on the Peltier effect where heat is released or absorbed at a junction of two dissimilar semiconductors when current flows through the junction. Since the direction of heat flow at the junction is determined by the direction of current flow in the junction, by reversing the direction of current flow a single device can be used to, alternatively, heat or cool the chuck.

When a wafer or other structure to be tested is placed on a relatively hotter or colder surface of a thermal chuck, a heat flux is induced over a substantial portion of the contacting surfaces and heat is, respectively, absorbed from or conducted to the chuck. Heat transfer to or from the wafer continues, elevating or depressing the temperature of the wafer, until the temperatures of the contacting surfaces equalize. Once the mass of the wafer has obtained a stable temperature, testing can be performed on the individual circuits making up the wafer. While generalized heating and cooling of the mass of the wafer with a thermal chuck produces the elevated or depressed temperatures desired for various testing regimes, the process is time consuming because the mass of the chuck and the wafer must be heated or cooled to modify the temperature of the individual dies that are to be tested. What is desired, therefore, is a method and apparatus for reducing the time required to test individual dies of a wafer at temperatures above or below the ambient temperature.

BRIEF DESCRIPTION OF THE DRAWINGS

FIG. 1 is a partial front view of an exemplary embodiment of a wafer probe station.

FIG. 2A is a top view of the wafer probe station of FIG. 1.

FIG. 3A is a partially sectional and partially schematic front view of the probe station of FIG. 1.

FIG. 3B is an enlarged sectional view taken along line 3B-3B of FIG. 3.

FIG. 3B is an enlarged sectional view taken along line 3A-3A of FIG. 3A.

DETAILED DESCRIPTION OF THE INVENTION

Figure 2B:
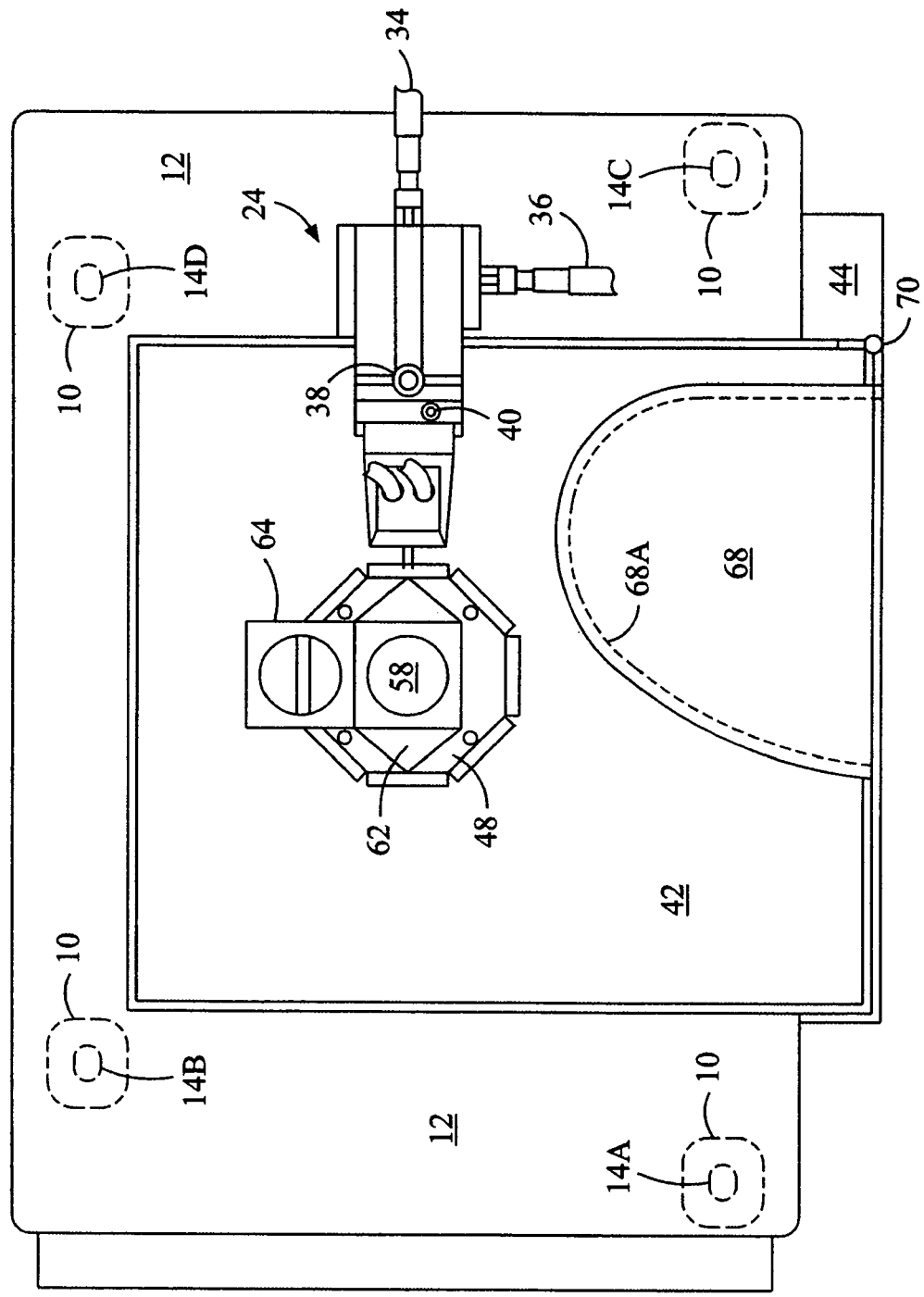
FIG. 2B is a partial top view of the wafer probe station of FIG. 1 with the enclosure door shown partially open.

Referring in detail to the drawings where similar parts of the invention are identified by like reference numerals, and referring in particular to FIGS. 1, 2 and 3; an exemplary embodiment of a probe station comprises a base 10 (shown partially) which supports a platen 12 through a number of jacks 14a, 14b, 14c, 14d which selectively raise and lower the platen vertically relative to the base by a small increment (approximately one-tenth of an inch). Also supported by the base 10 of the probe station is a motorized positioner 16 having a rectangular plunger 18 which supports a movable chuck assembly 20 for supporting a wafer or other structure to be tested. The chuck assembly 20 passes freely through a large aperture 22 in the platen 12 which permits the chuck assembly to be moved independently of the platen by the positioner 16 along X, Y and Z axes, i.e. horizontally along two mutually-perpendicular axes X and Y, and vertically along the Z axis. Likewise, the platen 12, when moved vertically by the jacks 14, moves independently of the chuck assembly 20 and the positioner 16.

Mounted atop the platen 12 are multiple individual probe positioners such as 24 (only one of which is shown), each having an extending member 26 to which is mounted a probe holder 28 which in turn supports a respective probe 30 for contacting wafers and other test devices mounted atop the chuck assembly 20. The probe positioner 24 has micrometer adjustments 34, 36 and 38 for adjusting the position of the probe holder 28, and thus the probe 30, along the X, Y and Z axes respectively, relative to the chuck assembly 20. The Z axis is exemplary of what is referred to herein loosely as the "axis of approach" between the probe holder 28 and the chuck assembly 20, although directions of approach which, are neither vertical nor linear, along which the probe tip and wafer or other test device are brought into contact with each other, are also intended to be included within the meaning of the term "axis of approach." A further micrometer adjustment 40 adjustably tilts the probe holder 28 to adjust planarity of the probe with respect to the wafer or other test device supported by the chuck assembly 20. As many as twelve individual probe positioners 24, each supporting a respective probe, may be arranged on the platen 12 around the chuck assembly 20 so as to converge radially toward the chuck assembly similarly to the spokes of a wheel. With such an arrangement, each individual positioner 24 can independently adjust its respective probe in the X, Y and Z directions, while the jacks 14 can be actuated to raise or lower the platen 12 and thus all of the positioners 24 and their respective probes in unison.

An environment control outer enclosure is composed of an upper box portion 42 rigidly attached to the platen 12, and a lower box portion 44 rigidly attached to the base 10. Both portions are made of steel or other suitable electrically conductive material to provide EMI shielding. To accommodate the small vertical movement between the two box portions 42 and 44 when the jacks 14 are actuated to raise or lower the platen 12, an electrically conductive resilient foam gasket 46, preferably composed of silver or carbon-impregnated silicone, is interposed peripherally at their mating juncture at the front of the enclosure and between the lower portion 44 and the platen 12 so that an EMI, substantially hermetic, and light seal are all maintained despite relative vertical movement between the two box portions 42 and 44. Even though the upper box portion 42 is rigidly attached to the platen 12, a similar gasket 47 is preferably interposed between the portion 42 and the top of the platen to maximize sealing.

Figure 5A:
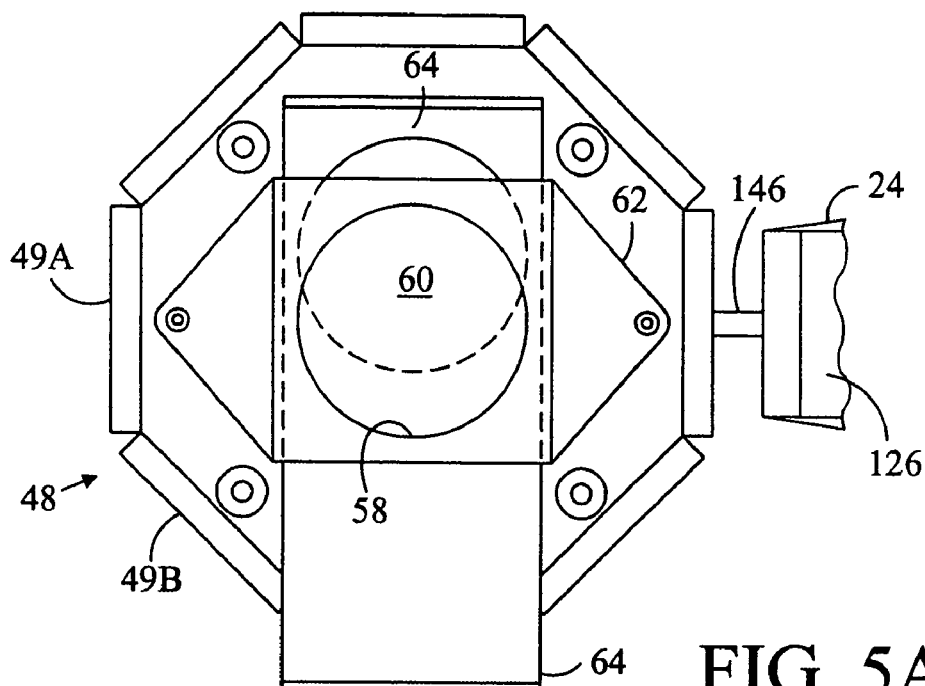
FIG. 5A is an enlarged top detail view taken along line 5A-5A of FIG. 1.
Figure 5B:
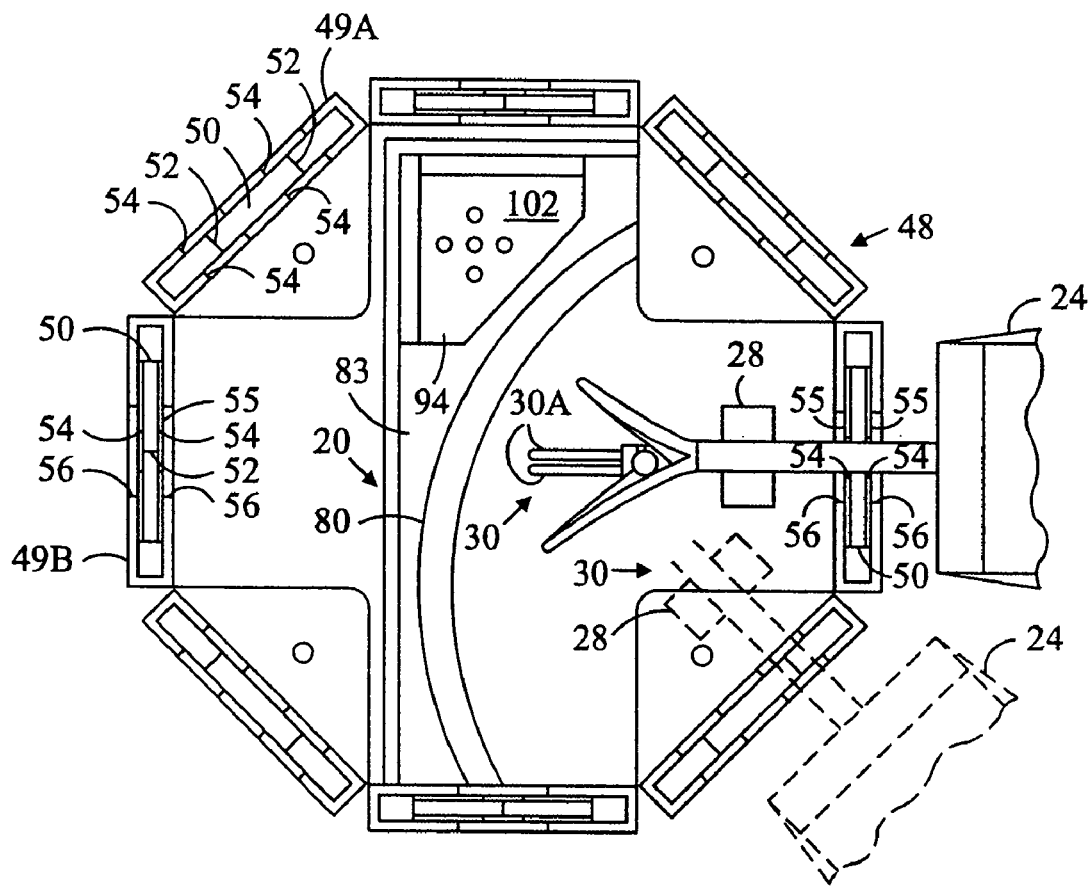
FIG. 5B is an enlarged top sectional view taken along line 5B-5B of FIG. 1.

With reference to FIGS. 5A and 5B, the top of the upper box portion 42 comprises an octagonal steel box 48 having eight side panels such as 49a and 49b through which the extending members 26 of the respective probe positioners 24 can penetrate movably. Each panel comprises a hollow housing in which a respective sheet 50 of resilient foam, which may be similar to the above-identified gasket material, is placed. Slits such as 52 are partially cut vertically in the foam in alignment with slots 54 formed in the inner and outer surfaces of each panel housing, through which a respective extending member 26 of a respective probe positioner 24 can pass movably. The slitted foam permits X, Y and Z movement of the extending members 26 of each probe positioner, while maintaining the EMI, substantially hermetic, and light seal provided by the enclosure. In four of the panels, to enable a greater range of X and Y movement, the foam sheet 50 is sandwiched between a pair of steel plates 55 having slots 54 therein, such plates being slidable transversely within the panel housing through a range of movement encompassed by larger slots 56 in the inner and outer surfaces of the panel housing.

Atop the octagonal box 48, a circular viewing aperture 58 is provided, having a recessed circular transparent sealing window 60 therein. A bracket 62 holds an apertured sliding shutter 64 to selectively permit or prevent the passage of light through the window. A stereoscope (not shown) connected to a CRT monitor can be placed above the window to provide a magnified display of the wafer or other test device and the probe tip for proper probe placement during set-up or operation. Alternatively, the window 60 can be removed and a microscope lens (not shown) surrounded by a foam gasket can be inserted through the viewing aperture 58 with the foam providing EMI, hermetic and light sealing.

The upper box portion 42 of the environment control enclosure also includes a hinged steel door 68 which pivots outwardly about the pivot axis of a hinge 70 as shown in FIG. 2A. The hinge biases the door downwardly toward the top of the upper box portion 42 so that it forms a tight, overlapping, sliding peripheral seal 68a with the top of the upper box portion. When the door is open, and the chuck assembly 20 is moved by the positioner 16 beneath the door opening as shown in FIG. 2A, the chuck assembly is accessible for loading and unloading.

Figure 4:
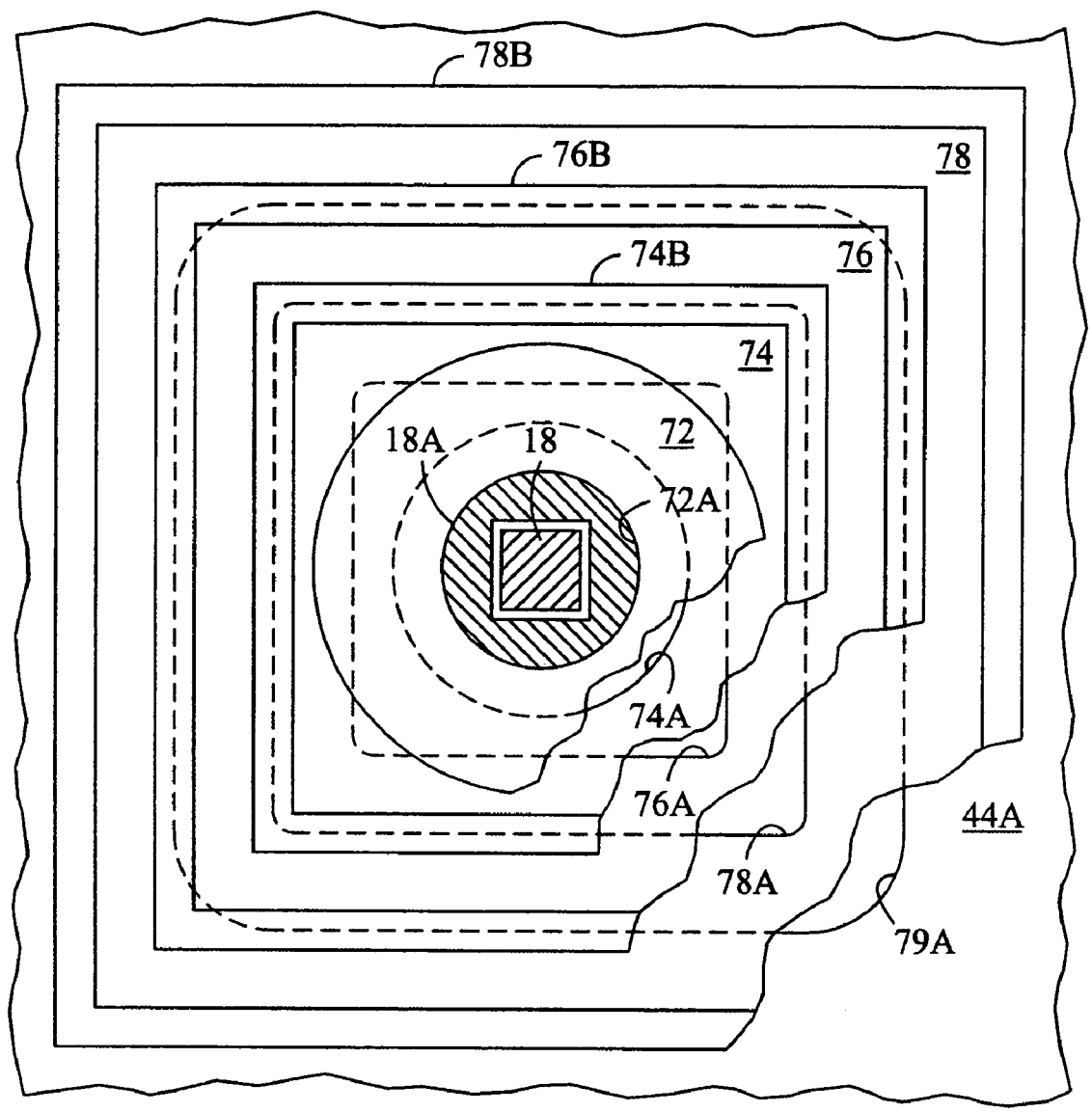
FIG. 4 is a top view of the sealing assembly where the motorized positioning mechanism extends through the bottom of the enclosure.

With reference to FIGS. 3 and 4, the sealing integrity of the enclosure is likewise maintained throughout positioning movements by the motorized positioner 16 due to the provision of a series of four sealing plates 72, 74, 76 and 78 stacked slidably atop one another. The sizes of the plates progress increasingly from the top to the bottom one, as do the respective sizes of the central apertures 72a, 74a, 76a and 78a formed in the respective plates 72, 74, 76 and 78, and the aperture 79a formed in the bottom 44a of the lower box portion 44. The central aperture 72a in the top plate 72 mates closely around the bearing housing 18a of the vertically-movable plunger 18. The next plate in the downward progression, plate 74, has an upwardly-projecting peripheral margin 74b which limits the extent to which the plate 72 can slide across the top of the plate 74. The central aperture 74a in the plate 74 is of a size to permit the positioner 16 to move the plunger 18 and its bearing housing 18a transversely along the X and Y axes until the edge of the top plate 72 abuts against the margin 74b of the plate 74. The size of the aperture 74a is, however, too small to be uncovered by the top plate 72 when such abutment occurs, and therefore a seal is maintained between the plates 72 and 74 regardless of the movement of the plunger 18 and its bearing housing along the X and Y axes. Further movement of the plunger 18 and bearing housing in the direction of abutment of the plate 72 with the margin 74b results in the sliding of the plate 74 toward the peripheral margin 76b of the next underlying plate 76. Again, the central aperture 76a in the plate 76 is large enough to permit abutment of the plate 74 with the margin 76b, but small enough to prevent the plate 74 from uncovering the aperture 76a, thereby likewise maintaining the seal between the plates 74 and 76. Still further movement of the plunger 18 and bearing housing in the same direction causes similar sliding of the plates 76 and 78 relative to their underlying plates into abutment with the margin 78b and the side of the box portion 44, respectively, without the apertures 78a and 79a becoming uncovered. This combination of sliding plates and central apertures of progressively increasing size permits a full range of movement of the plunger 18 along the X and Y axes by the positioner 16, while maintaining the enclosure in a sealed condition despite such positioning movement. The EMI sealing provided by this structure is effective even with respect to the electric motors of the positioner 16, since they are located below the sliding plates.

Figure 6:
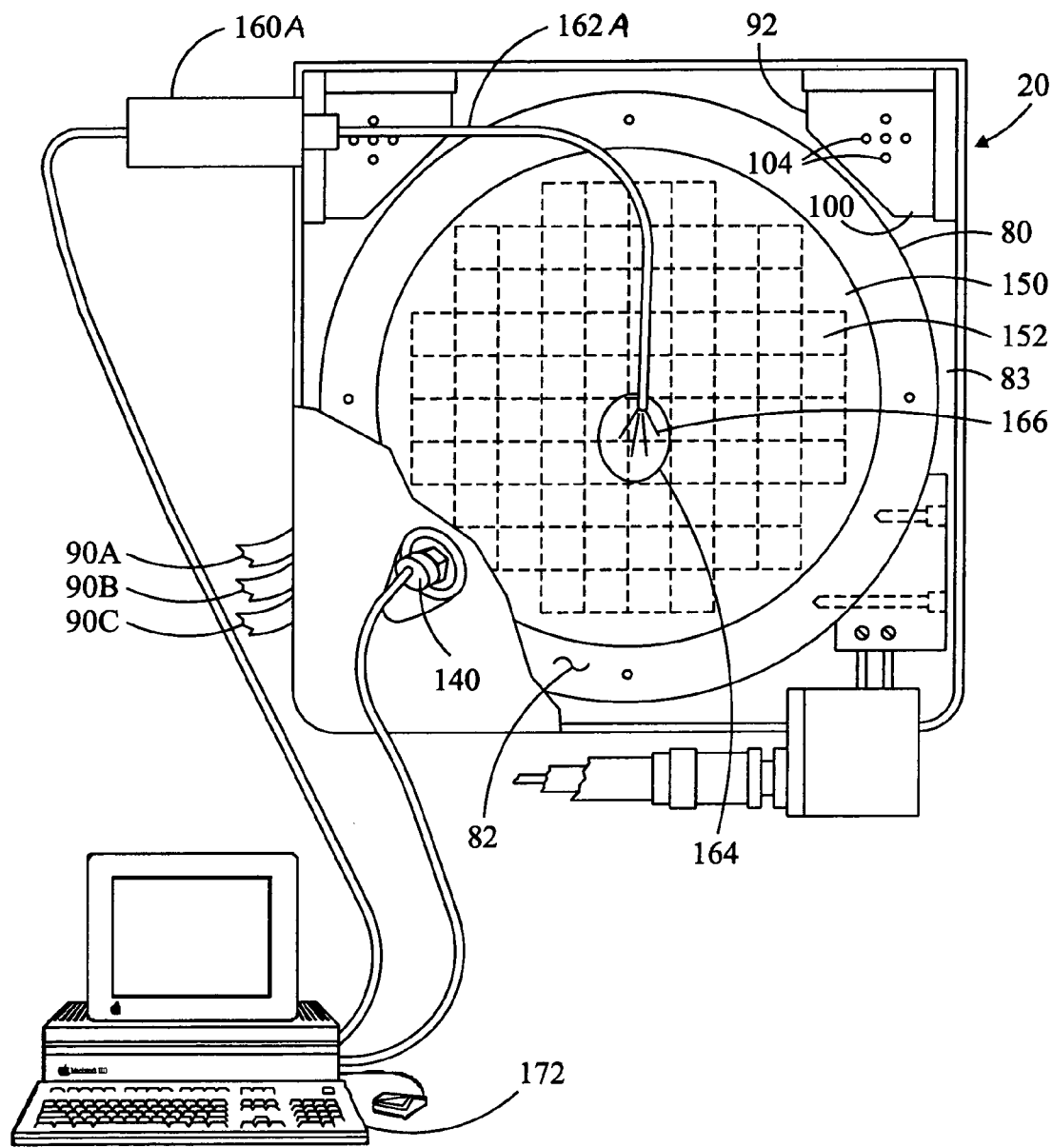
FIG. 6 is a schematic illustration of an apparatus for probe testing a device proximate a locally heated area of a structure supported on a chuck in a probe station.

With particular reference to FIGS. 3 and 6, the chuck assembly 20 is of a modular construction. The plunger 18 supports an adjustment plate 79 which in turn supports first, second, and third chuck assembly elements 80, 81 and 83, respectively, positioned at progressively greater distances from the probe(s) along the axis of approach. The lower chuck assembly element 83 is a conductive rectangular stage or shield 83 which detachably mounts conductive elements 80 and 81 of circular shape. In addition to having a lower surface 160 and a peripheral surface 162, the upper chuck assembly element or thermal plate 80 has a planar upwardly-facing wafer-supporting or upper surface 82 having an array of vertical apertures 84 therein. These apertures communicate with respective chambers separated by O-rings 88, the chambers in turn being connected separately to different vacuum lines 90A, 90B, 90C (FIG. 6) communicating through separately-controlled vacuum valves (not shown) with a source of vacuum. The respective vacuum lines selectively connect the respective chambers and their apertures to the source of vacuum to hold the wafer, or alternatively isolate the apertures from the source of vacuum to release the wafer, in a conventional manner. The separate operability of the respective chambers and their corresponding apertures enables the chuck to hold wafers of different diameters.

In addition to the circular elements 80 and 81, an auxiliary chuck 92 is detachably mounted on the corners of the element 83 by screws (not shown) independently of the elements 80 and 81 for the purpose of supporting contact substrates and calibration substrates while a wafer or other test device is simultaneously supported by the element 80. The auxiliary chuck 92 has its own separate upwardly-facing planar surface 100 in parallel relationship to the surface 82 of the element 80. Vacuum apertures 104 protrude through the surfaces 100 and 102 from communication with respective chambers within the body of each auxiliary chuck. Each of these chambers in turn communicates through a separate vacuum line and a separate independently-actuated vacuum valve (not shown) with a source of vacuum, each such valve selectively connecting or isolating the respective sets of apertures 104 with respect to the source of vacuum independently of the operation of the apertures 84 of the element 80, so as to selectively hold or release a contact substrate or calibration substrate located on the surface 100 independently of the wafer or other test structure. An optional metal shield 106 may protrude upwardly from the edges of the element 83 to surround or skirt the other elements 80, 81 and the auxiliary chuck 92.

All of the chuck assembly elements 80, 81 and 83, as well as the additional chuck assembly element 79, are electrically insulated from one another even though they are constructed of electrically conductive metal and interconnected detachably by metallic screws such as 96. With reference to FIGS. 3 and 3A, the electrical insulation results from the fact that dielectric spacers 85 and dielectric washers 86 are provided. These, coupled with the fact that the screws 96 pass through oversized apertures in the lower one of the two elements which each screw joins together thereby preventing electrical contact between the shank of the screw and the lower element, provide the desired insulation. Preferably the spacers and washers 85 and 86, respectively, are constructed of a material having a low dielectric constant, high dimensional stability, and high volume resistivity. A suitable material for the spacers and washers is glass epoxy, or acetal homopolymer marketed under the trademark Delrin by E. I. DuPont.

Referring to FIG. 6, a semiconductor wafer or other structure 150 comprising a plurality of dies or other devices 152 to be tested is supported on the top surface 82 of the thermal chuck 20 in preparation for probe testing at a non-ambient temperature. A wafer 150 typically includes many individual dies 152 or chips, each comprising an individual integrated circuit or discrete semiconductor device. The performance of an individual die or device under test (DUT) is tested by bringing the probes 30 into contact with test pads that are connected to the circuit or device comprising the die. The probes 30 are connected to instrumentation that applies a known excitation, through the probes, to certain test pads and measures the resulting response of the circuit or device to the excitation. While the probes 30 commonly are used to sense parameters related to electrical output resulting from electrical excitation of the circuitry of a die on wafer, the probes may be used to detect other outputs, such as light emission, and apply non-electrical excitation, such as light or other forms of radiation, to devices 152 or dies of suitable structures and the terms wafer and structure are used interchangeably herein to refer to a structure including one or more individual dies or devices to be tested.

To test the performance of a DUT, for example device 166 at a non-ambient temperature, thermal devices 154 in the chuck 20 are operated to alter the temperature of the top surface 82 of the chuck. The thermal devices 154 may be heat sources, such as plate heaters, coil heaters, mica heaters, thin film heaters or heater rods, supplying heat to elevate the temperature of the upper surface 82 of the chuck 20. On the other hand, the thermal devices 154 may be heat sinks, such as heat pipes or passages for the circulation of cooled liquid or gas, absorbing heat and depressing the temperature of the surface 82 of the chuck 20 to enable testing at temperatures below the ambient temperature. In the exemplary thermal chuck 20, the thermal devices 154 are preferably thermoelectric devices comprising a plurality of electrically connected thermocouples of p- and n-type semiconductor material sandwiched between two plates of electrically insulating, thermally conducting material. When DC power is applied to the semiconductor junctions comprising the thermocouples, heat is transferred from one plate to the other as a result of the Peltier effect. As electrons move from the p-type material to the n-type material through an electrical connection, the electrons jump to a higher energy state, absorbing thermal energy at the cold side plate. Continuing through the material, the electrons flow from the n-type material to the p-type material and drop to a lower energy state releasing energy as heat to the hot side plate. The thermoelectric device functions as a bi-directional heat pump because the direction of heat flow is reversible by reversing the direction of current flow in the semiconductor junctions. Exposing the top surface 82 of chuck 20 to the warmer or cooler plate of the thermoelectric devices 154 will, respectively, heat or cool the upper surface and, thereby, the wafer or other structure 150 supported on the surface.

A difference in temperature between the contacting surfaces of the wafer 150 and the chuck 20 induces a heat flux causing heat to be conducted through a substantial portion of the area of the surface of the wafer in contact with the chuck. If the surface 82 of the chuck 20 is cooler than the surface 156 of the wafer 150, the heat flux is negative or out of the wafer with the chuck sinking heat to cool the wafer. On the other hand, if the surface 82 of the chuck 20 is warmer than the contacting surface 156 of the wafer 150, the chuck is a heat source and the heat flux is positive or into the surface of the wafer increasing the temperature of the wafer's mass. Heat is transferred into or out of the wafer until the temperatures of the contacting surfaces of the wafer 150 and the chuck 20 substantially equalize. Once the temperature of the wafer has stabilized, the probes 30 can be brought into contact with the test pads on the DUT 166 and testing can begin.

While thermal chucks can be used to heat or cool wafers or other structures for testing over a wide range of temperatures, probe testing at elevated or depressed temperatures is a slow process because the mass of the entire wafer must be heated or cooled to the test temperature to stabilize the temperature of the DUT at the desired testing temperature. In addition to reducing the productivity of the probe station, the relatively long time required to bring the temperature of the wafer or other structure to the desired testing temperature prevents testing the DUT under conditions of rapidly changing temperatures. Further, the temperature varies over the surface of the thermal chuck and, since heat from the chuck is transferred through a surface of the structure in contact with the chuck and probing is typically performed on the opposing surface of the structure, it is difficult to accurately determine the testing temperature of the particular DUT being probed. The inventor concluded that the time required to perform probe testing at non-ambient temperatures could be significantly reduced and the accuracy of the testing improved by inducing a heat flux over a relatively small local area of the wafer that includes or is proximate to the device under test.

To heat a local area of a wafer or other structure 150, the probe station includes a laser 160A attached to the corner of the box 42 and an optical fiber 162A to direct the light beam to an area 164 of the wafer proximate the die or other device under test 166. While an optical fiber can be used to direct the laser's beam to the wafer 150, the laser could be focused directly on a local area 164 proximate the DUT 166, or indirectly through a lens system. By selecting an appropriate optical lens, the local area illuminated and heated by the laser's beam can vary from a substantial portion of the surface area of the wafer 150 to approximately the area of a die 152. A $CO_2$ laser can be used to heat semiconductor wafers of silicon. The photons produced by a $CO_2$ laser have a 10.6 micron wavelength and are absorbed by a multiphonon interaction with silicon, but have insufficient energy to cause electronic transitions in the material. Lasers based on other materials may be also used for localized heating of silicon or other materials comprising the structure to be tested.

Radiation incident on a surface is either transmitted, absorbed, or reflected. The net energy available for local heating from a radiantly illuminated area equals the difference between the rate of heat input and the rate at which is conducted way, or:

$$\frac{dQ_h}{dt} = \frac{dQ_a}{dt} - \frac{dQ_c}{dt} \tag{1}$$

where: $Q_h$=net energy available for heating
$Q_a$=energy absorbed
$Q_c$=energy conducted away for the illuminated area For a time interval $\Delta t$:

$$\frac{\Delta Q_h}{\Delta t} = mC\frac{\Delta T}{\Delta t} \tag{2}$$

where: m=mass of the heated area
C=the specific heat of the material
$\Delta T$=temperature rise resulting from net energy input $$\frac{\Delta Q_a}{\Delta t} = \alpha \pi r^2 \frac{\Delta E_i}{\Delta t} \tag{3}$$

where: r=radius of the heated area
$\alpha$=absorption coefficient
$\Delta E_i$=incident energy per unit area in the time interval Conduction perpendicular to the surface over the interval $\Delta t$ equals:

$$\frac{\Delta Q_c}{\Delta t} = -k_z \pi r^2 \frac{\Delta T}{\Delta z} \tag{4}$$

where: $k_a$=thermal conductivity of the structure in the z direction

For conduction radially away from the illuminated area:

$$\frac{\Delta Q_c}{\Delta t} = -2k_r \pi r p \frac{\Delta T}{\Delta r} \tag{5}$$

where: $k_r$=thermal conductivity in the r direction
p=penetration depth within which the radiation is absorbed The temperature increase for a local area of the a silicon wafer can be estimated from equations 1-5. For a 1 mm thick wafer illuminated by a laser pulse having energy of 1 J/cm², a time duration of 10 μs and producing a temperature rise of 200° K., the conduction vertical to the surface equals:

$$\frac{\Delta Q_c}{\Delta t} = -k_z \pi r^2 \frac{\Delta T}{\Delta z} = 0.0296 \pi r^2$$

where: $k_z$=1.48 W/cm ° K.
$\rho$=2.33 g/cm³
C=0.71 J/g ° K.
$\alpha$=0.2 (estimated)

Conduction radially about the illuminated area is assumed to be much smaller than conduction vertically through the wafer and radial conduction can be neglected. The rate of heat input in the time interval, $\Delta t$, equals:

$$\Delta Q_a = \alpha \pi r^2 \Delta E_i = 0.2 \pi r^2$$

Since the energy absorbed ($\Delta Q_a$) is much greater than the energy conducted away from the illuminated area ($\Delta Q_c$) the conduction loss can be ignored and the net energy available for heat ($\Delta Q_h$) equated to the rate of heat input ($\Delta Q_a$). Therefore:

$$\Delta T = \frac{\Delta Q_h}{mC} = \frac{\Delta Q_h}{\rho \pi r^2 pC} = \frac{0.2\pi r^2}{2.33\pi r^2 (0.1)(0.71)} \approx 1.21° \text{ K}$$

Since the estimated energy absorbed is directly proportional to the energy output of the laser, increasing the energy of the laser pulse to 100 J/cm² would be sufficient to increase the temperature of the wafer in the area illuminated by the laser by approximately 120° K. Carbon dioxide lasers with power levels many times this level are available and a laser with modest energy output can rapidly heat a small area of the wafer 150 or other structure. Coordinated pulsing of the laser to heat a local area 164 of the wafer followed by probing of the dies, proximate the heated area, can significantly improve the productivity of the probe station when testing at non-ambient temperatures. Pulsed energy input can also be used to cyclically heat an area for testing under dynamic temperature conditions.

Localized heating of a suitable DUT could be accomplished with a radiant heater, such as a resistance heater or thin film heater that can be positioned adjacent to the DUT, or by a suitably focused electron beam if electrical interference with the operation of the tested device or instrumentation is not an issue.

Determining and controlling the temperature of a DUT heated or cooled by a thermal chuck is difficult. Typically, the temperatures, across the wafer supporting surface, vary from approximately 1° C.-3° C. depending upon the temperature of the chuck. In addition, the temperature of the wafer supporting surface is controlled by varying the output of the thermal devices in the chuck in response to the sensing of a temperature of the chuck's structure. Since the temperature of the wafer is controlled by controlling the temperature of the chuck and since the heat flux is applied or sunk at the lower surface of the wafer, while probing occurs on the upper surface of the wafer, it is difficult to control or determine the temperature of the DUT during testing.

The probe station includes an infrared temperature measurement system to measure the temperature of the area of localized heating or cooling. The infrared temperature measurement system is a non-contact temperature measuring system comprising a sensing head 170, including circuitry to output a digital signal, and a computer 172 to process the signals output by the sensing head. The wafer 150 emits infrared radiation, known as characteristic radiation, with a wavelength ranging from 0.7 to 1000 µm and an intensity that varies according to temperature. The sensing head of the infrared temperature measuring system responds to the intensity of the infrared radiation emitted by a spot or area of a surface that is optically visible to the sensing head. The sensing head 170 is focused on the area of localized heating 164 and outputs a signal to a computer 172 corresponding to the sensed temperature of the local area. Infrared radiation behaves according to known optical principles and can be directed to the sensing head by deflection and focusing with a lens or optical fiber or reflection from reflective surfaces, if the locally heated area is not directly visible, optically, from a convenient location for the sensing head. The computer 172 that processes the signals from the sensing head 170 of infrared temperature measuring system also controls the laser 160A providing localized heating of the wafer. The computer 172 will pulse the laser at different rates and for different intervals in response to temperature signals generated by the infrared temperature measurement system to control of the temperature of the area of localized heating. Since the infrared temperature measurement system measures the temperature of the surface on which probing is to take place adjacent to the DUT, the temperature of the DUT can be precisely determined and controlled. The computer 172 can also repeatedly energize the laser 160A to enable thermal cycling of the DUT 166.

Figure 10:
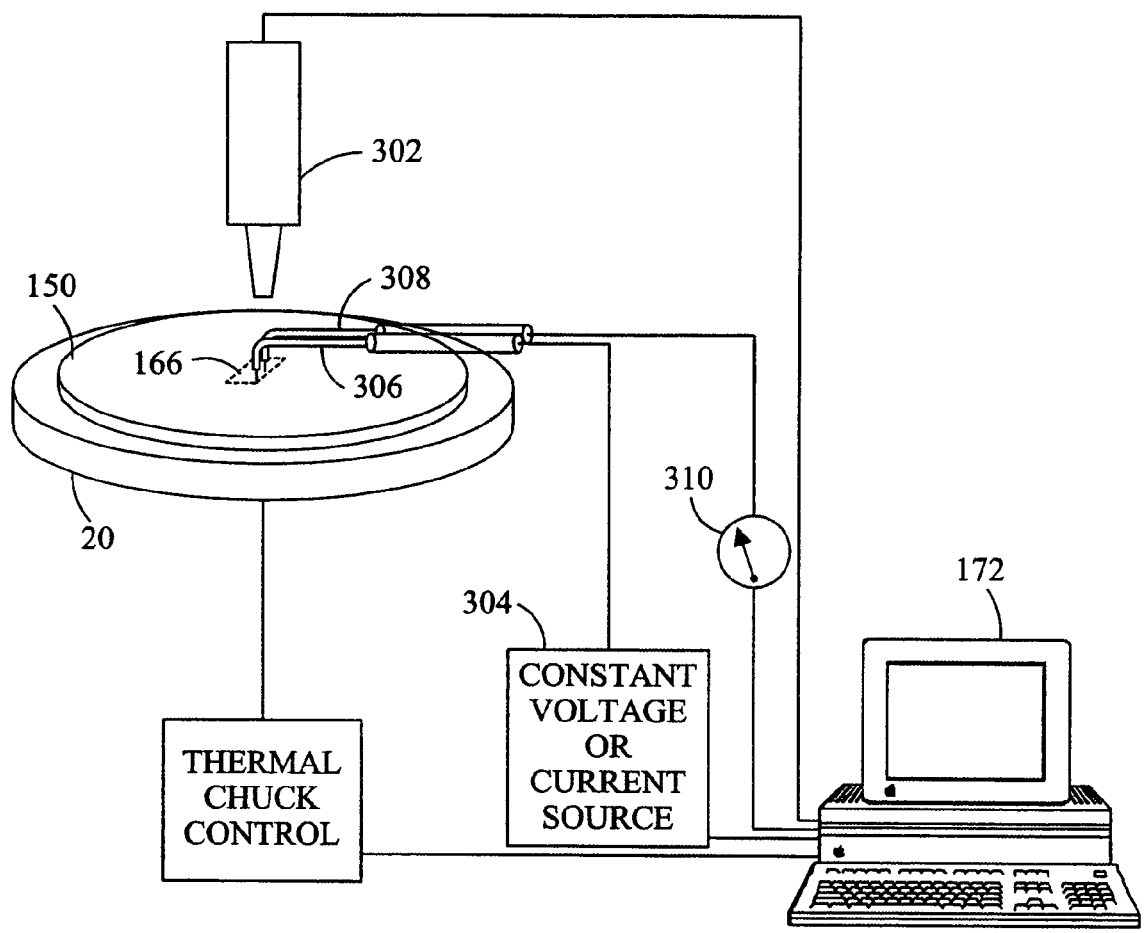
FIG. 10 is a schematic illustration of a system for controlling localized heating of a wafer.
Figure 11:
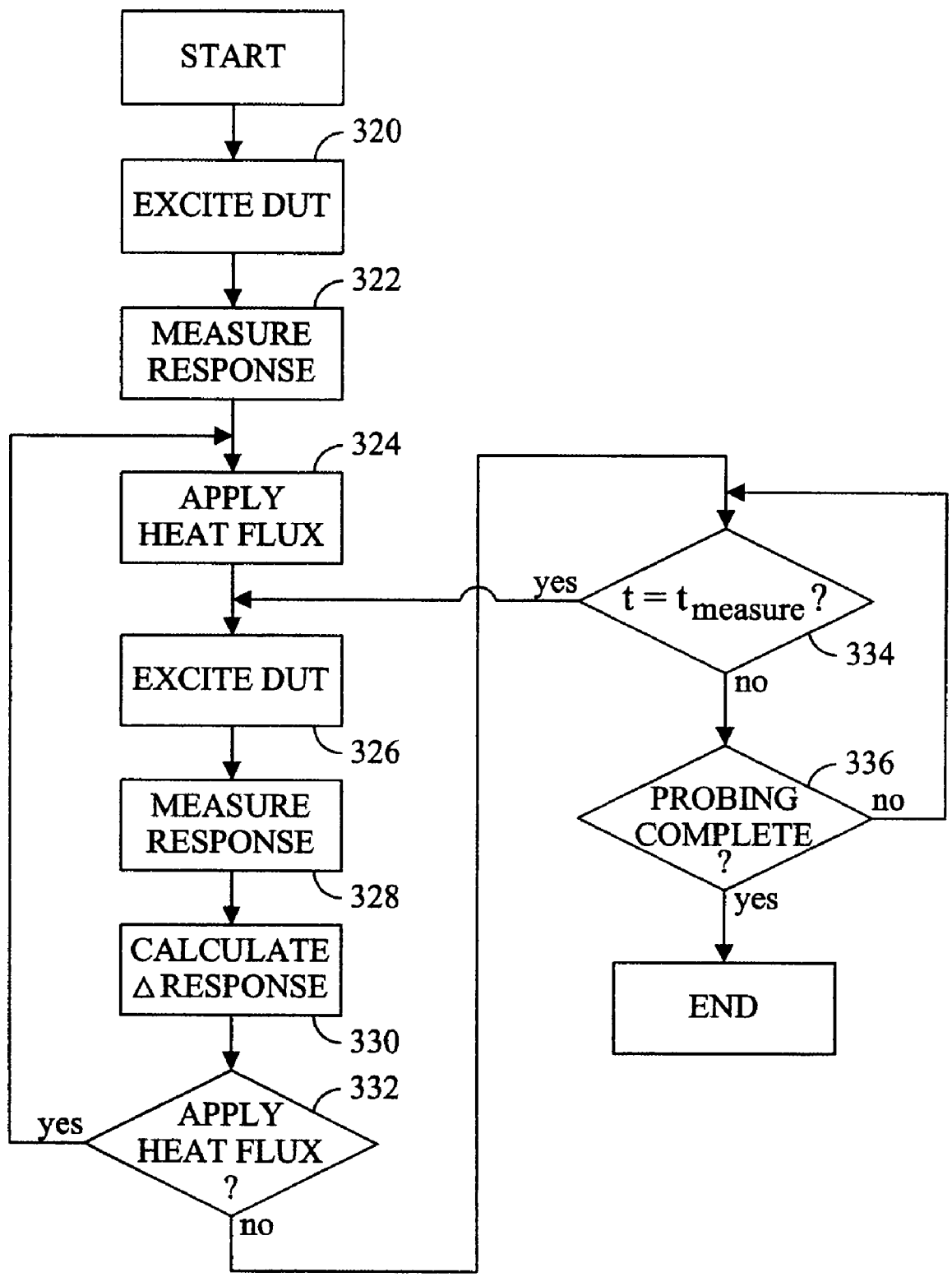
FIG. 11 is a flow diagram of a method for controlling localized heating of a wafer or other structure.

Referring in particular to FIGS. 10 and 11, the response of a DUT can also be used to control the temperature of the area of localized heating or cooling. The resistance of a semiconductor junction and other circuit elements varies directly with the temperature of the die. If a constant voltage is applied to a semiconductor junction, the current flow through the junction will decrease as the temperature of the junction increases. Likewise, if a constant current is flowing through a junction, the voltage drop through the junction will respond directly to a change in temperature of the junction. By calibrating the response of the circuitry of a DUT to changes in temperature and periodically exciting the circuit with a constant voltage or current, the probing system can determine whether additional heating or cooling is required to bring the local area of the wafer proximate the DUT to a stable test temperature.

A source of a heat flux, for example a laser 302, is focused on a local area of a wafer 150 proximate a DUT 166. A computer 172 controls the operation of the source of heat flux and, therefore, the energy applied to or sunk from the local area of the wafer. A source 304 is connectable to the probes 306, 308 and provides either a constant voltage or a constant current to excite the circuitry of the DUT 166 when the temperature is to be measured 320. The initial response of the DUT 166 to the excitation 322 is determined by the output instrument 310 and input to the computer 172. The computer then energizes the laser 302 to induce a heat flux through the surface of the wafer 150 at the area of localized heating 324. After the laser 302 has been energized, the computer 172 connects the source 304 to the DUT 326 and measures the response of the DUT to the input excitation 328. The arithmetic logic unit of the computer 172 calculates the change in response of the DUT 330 as a result of the temporally successive excitation of the DUT. The computer 172 compares the change in response of the DUT to a table of values calibrating a change in response of a DUT to a change in temperature to determine if additional heat flux should be applied to the wafer. If the temperature has not stabilized at the test temperature, the computer energizes the source of heat flux 324 or signals the thermal chuck control 312 to energize the thermal devices of the thermal chuck 20 to further alter the temperature of the local area 324. If additional heat flux is not required 332, the system waits for a predetermined period 334 before again exciting the DUT 326, and measuring the response of the DUT 328. The computer 172 adjusts the output of source of heat flux to control and stabilize the temperature of the DUT at the testing temperature until the probing is complete 336.

The thermal chuck 20 can be used induce a heat flux through a substantial portion of the surface of the wafer or other structure 150 contacting the chuck to provide generalized temperature modification to the structure to reduce thermal stress arising from localized heating or cooling of the structure. However, since thermal stresses are substantially proportional to temperature differences in the structure 150, it is not necessary to heat or cool the entire mass of the structure to the test temperature to avoid damaging thermal stresses. Since the mass of the structure 150 need not be heated or cooled to test temperature, less heat must be absorbed or emitted by the structure before testing can begin. As a result, the productivity of the probe station is substantially increased by providing two sources of heat flux for the structure being tested; one inducing a heat flux to heat or cool a local area of the structure adjacent to the DUT to elevate or depress the temperature of the particular device or die to the proper testing temperature and the second, a generalized source, modifying the temperature of the mass of the structure to a more moderate temperature than the testing temperature by inducing heating or cooling through a substantial portion of the surface area of the structure in contact with the chuck.

Figure 7:
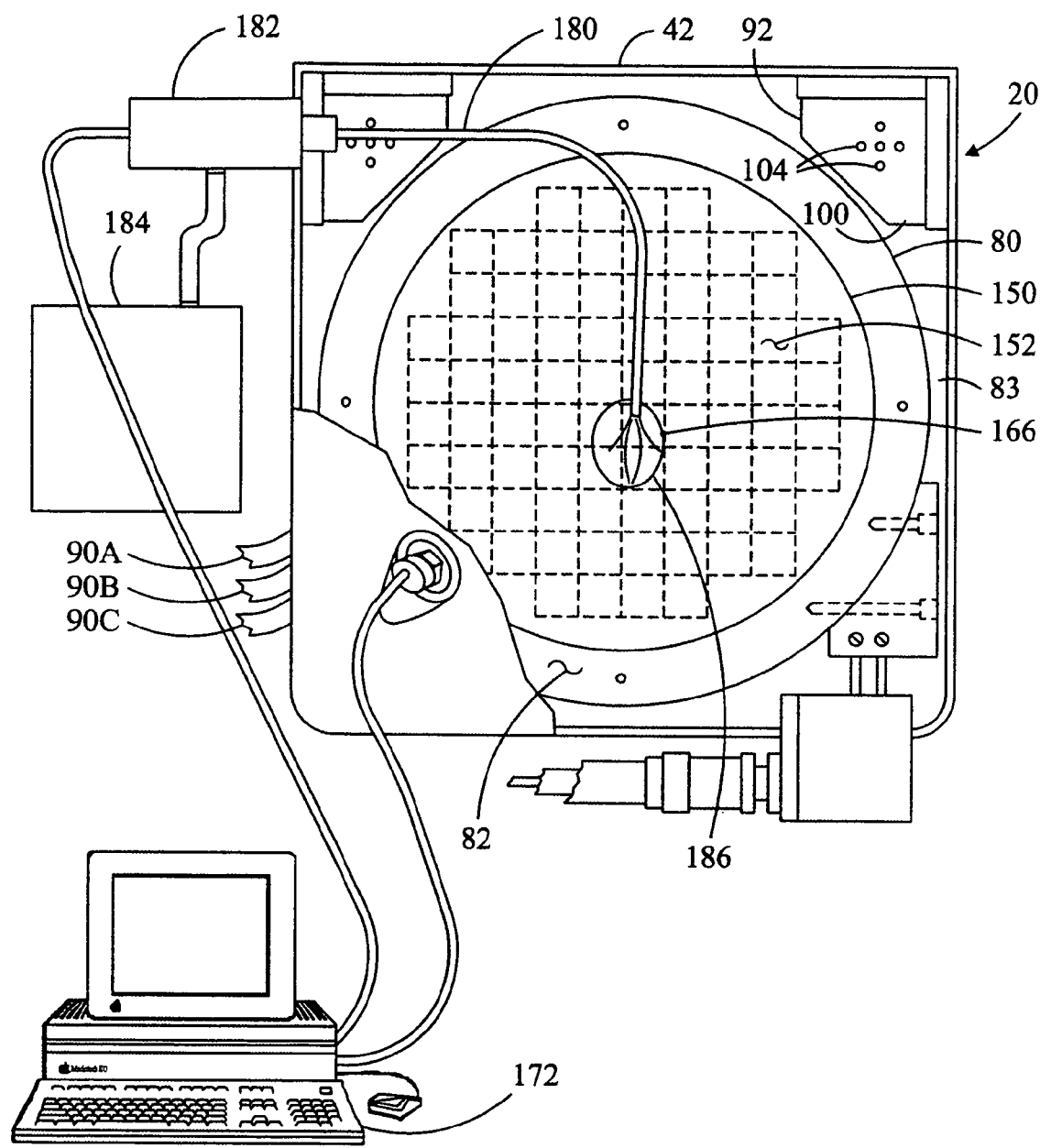
FIG. 7 is a schematic illustration of an apparatus for probe testing a device proximate a locally cooled area of a structure supported on a chuck in a probe station.

Temperature localization can also be used when testing devices at depressed temperatures. The thermal chuck 20 is equipped with thermal electric devices can be used to cool the wafer or other structure 150 that includes the DUT 166. Reversing the flow of current in the thermoelectric devices will reverse the direction of heat flow in the device cooling the upper surface 82 of the chuck 20 and producing a negative heat flux at the surface 156 of the structure 150 in contact with the chuck. Referring to FIG. 7, a second embodiment of the probe station includes a tube 180, affixed to and penetrating the box 42, that is attached to a valve 182 controlling a flow of refrigerated gas from a source 184. The refrigerated gas is typically compressed air that is cooled by a heat pump which may comprise a plurality of thermoelectric devices. The compressed refrigerated gas flows through the control valve 182 and the tube 180 which is arranged to direct the refrigerated gas at a local area 186 of the wafer 150 or other structure restrained on the surface of the chuck 20. The refrigerated gas impinges on a local area 186 of structure 150 and induces a negative heat flux through the upper surface of the structure to further cool the structure proximate to a particular DUT, for example, die 166. The computer 172 responds to temperature signals from the temperature sensing head 170 and operates the control valve 182 to control the flow of refrigerant and the temperature of the area of localized cooling.

Combining a generalized heat sink for the wafer 150 or other structure and localized heating for the DUT 166, can be used to improve temperature accuracy when testing at low temperatures or to thermally cycle a DUT. Operating the thermal chuck 20 as a heat sink can be used to depress the temperature of the wafer 150 or other structure to a temperature below the test temperature. The local area proximate the DUT 166 can then be heated with the laser 160A or other local heat source to an accurate test temperature that is cooler than the ambient temperature. Cycling the heat flux induced by the local heat source can cause fluctuation in the temperature of the DUT 166, even though the temperature of the DUT remains below the ambient temperature.

A thermal chuck 20 including heating elements can also be used in combination with localized cooling to test thermal effects of cooling a heated die or device.

Figure 8:
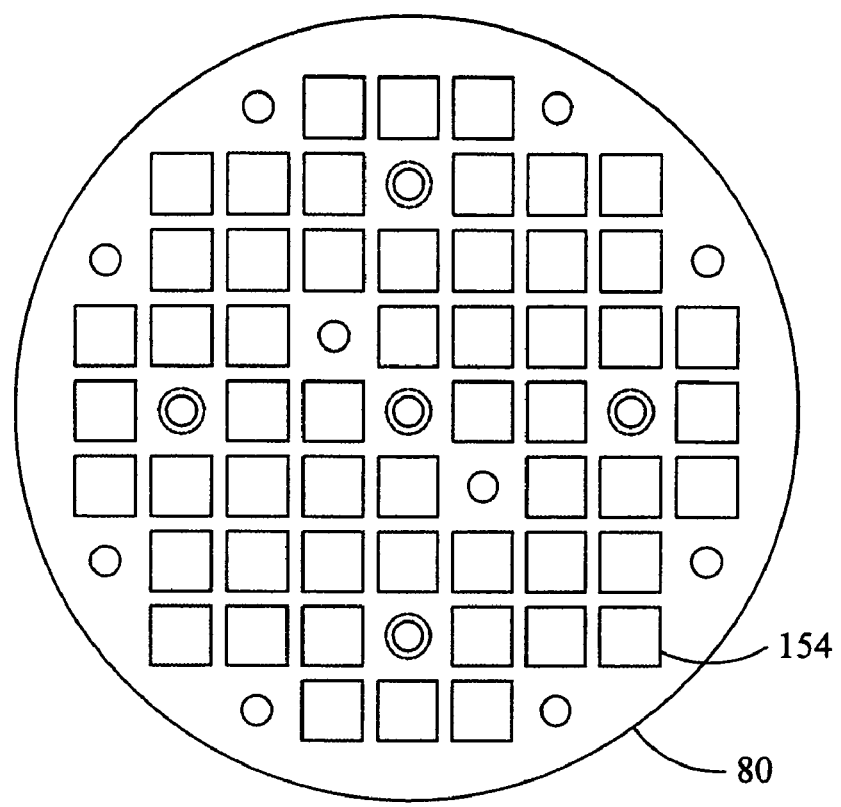
FIG. 8 is a schematic illustration of the underside of a thermal plate having a plurality of thermal devices for modifying the temperature of a thermal chuck.
Figure 9:
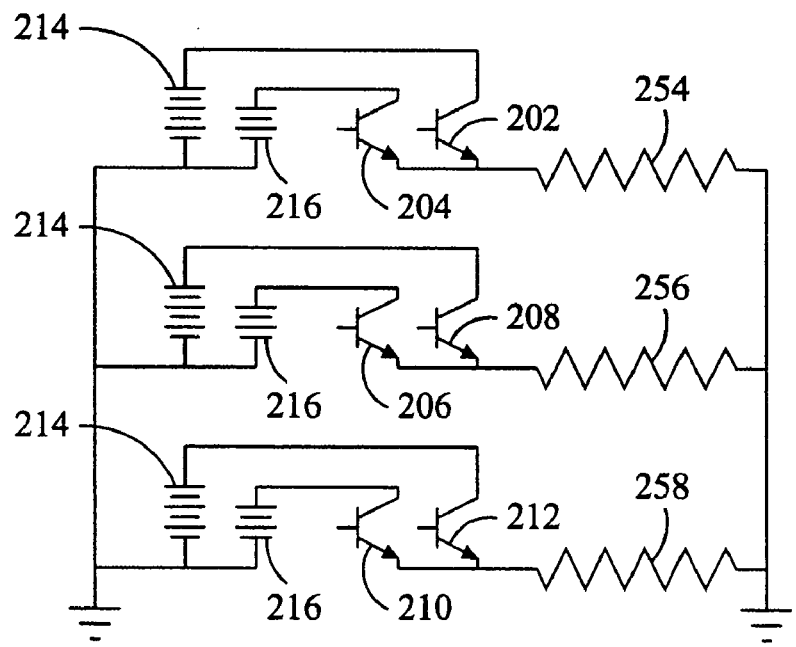
FIG. 9 is an electrical schematic of a circuit for selectively energizing individual thermal devices of the thermal plate of FIG. 8.

Heating and cooling a localized area of a wafer or other structure 150 can also be accomplished with a thermal chuck comprising a plurality of individually operable thermal devices. Referring to FIG. 8, the upper element or thermal plate 80 of the chuck 20 includes a plurality of thermal devices 154. Preferably, the thermal devices 154 are thermoelectric devices that can, alternately, cool or heat the top surface 82 of the thermal chuck by reversing the direction of current flow in the device. However, the thermal devices could comprise resistance heaters or other devices. Referring to FIG. 9, resistive thermal devices 254, 256, 258 are individually connectable, through transistors 202, 204; 206, 208; 210, 212, respectively, to one of the power sources 214, 216, represented schematically as batteries of differing voltages. By energizing, the appropriate transistor of each pair of transistors 202, 204; 206, 208; 210, 212, one or more of the thermal devices 254, 256, 258 is operable at a first voltage producing a first heat flux while other thermal devices are operated at another voltage producing a second heat flux. As a result, an area of the top surface 82 of the chuck 20 can be the source of a first heat flux through a substantial portion of the surface 156 of the wafer or other structure 150 in contact with the chuck. A second heat flux, produced by one or more thermal devices 154 operating at a second voltage, can be induced in a local area of the surface 156 of the wafer 150 that is proximate the DUT 166 to produce a temperature in the DUT that is different than the temperature of a substantial portion of the wafer's mass. The size and location of the area subjected to localized heating or cooling can be varied by altering the numbers and locations of the thermal devices connected to each of the respective power sources. By connecting appropriate thermal devices to appropriate power supplies, the percentage of the surface area of the wafer that is subjected to localized heating or cooling may be varied. Between 10% and 75% of the surface area of the chuck can be heated to the local area temperature and, if the DUT occupies a sufficiently large portion of the surface of the wafer or other structure or if the thermal devices are sufficiently small, the local heating area may approximate the area occupied by a single die 152 or device.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A method of testing a device at a target temperature, said device being one of a plurality of devices included on a structure having at least one structure surface with a structure surface area, said method comprising the steps of:
   (a) inducing a first heat flux through a structure surface over a substantial portion of said structure surface area;
   (b) inducing a second heat flux through a surface of a local area of said structure, said local area being smaller than, and within, said structure surface area and proximate said device to be tested;
   (c) sensing the temperature of said local area of said structure while said first heat flux and said second heat flux are induced through said surface;
   (d) varying said second heat flux in response to the sensed said temperature of said local area so as to achieve said target temperature at said device to be tested; and
   (e) measuring a performance parameter for said device at said target temperature.

2. The method of testing a device of claim 1 wherein said performance parameter is measured by at least one probe contacting said device to be tested.

3. The method of testing a device of claim 2 wherein said second heat flux is induced into said structure.

4. The method of testing a device of claim 2 wherein said second heat flux is induced out of said structure.

5. The method of testing a device of claim 1 wherein said second heat flux is provided by a laser that is pulsed over different intervals in response to the sensed said temperature of said local area.

6. The method of claim 5 wherein said target temperature at said device varies with time.

7. The method of testing a device of claim 6 wherein said target temperature varies cyclically with time.

8. The method of testing a device of claim 1 wherein said local area comprises less than seventy five percent of said structure surface area.

9. The method of testing a device of claim 1 wherein said local area comprises less than fifty percent of said structure surface area.

10. The method of testing a device of claim 1 wherein said local area comprises less than twenty five percent of said structure surface area.

11. The method of testing a device of claim 1 wherein said local area comprises less than ten percent of said structure surface area.

12. The method of testing a device of claim 1 wherein said local area approximates a device area of said device.

13. The method of testing a device of claim 1 further comprising varying said first heat flux in response to the sensed said temperature of said local area so as to achieve said target temperature at said device to be tested.

14. The method of testing a device of claim 1 wherein the step of sensing a temperature of said local area of said structure comprises the steps of:
   (a) exciting said device;
   (b) measuring a first response of said device to said excitation;
   (c) inducing a heat flux through a surface of said local area;
   (d) measuring a second response of said device to said excitation following said inducement of said heat flux through said surface of said local area; and
   (e) inducing additional heat flux through said surface of said local area if said second response of said device has a predetermined relationship to said first response.

15. The method of testing a device of claim 14 wherein step of exciting said device comprises an application of a constant voltage to said device.

16. The method of testing a device of claim 14 wherein step of exciting said device comprises an application of a constant current to said device.

17. An apparatus for testing a device at a temperature, said device being one of a plurality of devices included on a structure having at least one structure surface with a structure surface area, said apparatus comprising:
   (a) a first heat flux origin inducing a first heat flux through a structure surface over a substantial portion of said structure surface area;
   (b) a second heat flux origin inducing a second heat flux through a local area of a structure surface, said local area being smaller than said structure surface area and proximate said device to be tested;
   (c) a probe for measuring a performance parameter of said device by contacting a test pad on a surface of said device;
   (d) a temperature sensor sensing a temperature of said local area wherein said temperature sensor comprises:
      (ii) a source of excitation connectable to said device;
      (ii) an output instrument to measure a response of said device to excitation by said source;
      (iii) an arithmetic device to determine a difference between a first response from said output instrument and a temporally successive second response from said output instrument; and
      (iv) a comparator to compare said difference to a value that calibrates a response of said output instrument to a temperature of said device; and
   (e) a control responding to said sensed temperature of said local area to vary at least one of said first heat flux and said second heat flux.

18. The apparatus for testing a device of claim 17 wherein said first heat flux origin is a heat source.

19. The apparatus for testing a device of claim 18 wherein said second heat flux origin is a heat source.

20. The apparatus for testing a device of claim 18 wherein said second heat flux origin is a heat sink.

21. The apparatus for testing a device of claim 17 wherein said first heat flux origin is a heat sink.

22. The apparatus for testing a device of claim 21 wherein said second heat flux origin is a heat source.

23. The apparatus for testing a device of claim 21 wherein said second heat flux origin is a heat sink.

24. The apparatus for testing a device of claim 17 wherein said second heat flux origin induces said second heat flux through said local area comprising less than seventy five percent of said structure surface area.

25. The apparatus for testing a device of claim 17 wherein said second heat flux origin induces said second heat flux through said local area comprising less than fifty percent of said structure surface area.

26. The apparatus for testing a device of claim 17 wherein said second heat flux origin induces said second heat flux through said local area comprising less than twenty five percent of said structure surface area.

27. The apparatus for testing a device of claim 17 wherein said second heat flux origin induces said second heat flux through said local area comprising less than ten percent of said structure surface area.

28. The apparatus for testing a device of claim 17 wherein said second heat flux origin induces said second heat flux through said local area approximating a device area of said device.

29. The apparatus for testing a device of claim 17 wherein said first heat flux origin comprises a thermal chuck.

30. The apparatus for testing a device of claim 17 wherein said second heat flux origin comprises an optical source.

31. The apparatus for testing a device of claim 30 wherein said optical source comprises a laser.

32. The apparatus for testing a device of claim 30 where said optical source comprises a carbon dioxide laser.

33. The apparatus for testing a device of claim 17 wherein said control responds to said sensed temperature by varying a pulse produced by said second heat flux origin.

34. The apparatus for testing a device of claim 17 wherein said temperature sensor comprises an infrared radiation sensor.

35. The apparatus for testing a device of claim 17 wherein said source of excitation comprises a voltage source.

36. The apparatus for testing a device of claim 17 wherein said source of excitation comprises a current source.

* * * * *

UNITED STATES PATENT AND TRADEMARK OFFICE
CERTIFICATE OF CORRECTION

PATENT NO. : 7,330,041 B2  Page 1 of 1
APPLICATION NO. : 11/086126
DATED : February 12, 2008
INVENTOR(S) : Bruce McFadden It is certified that error appears in the above-identified patent and that said Letters Patent is hereby corrected as shown below:

On the title page, Abstract
Change "modify the temperature the device under test." to --modify the temperature of the device under test.--.

Col. 1, line 30
Change "into contact the test pads" to --into contact with the test pads--.

Col. 2, lines 28-29
Delete "FIG. 3B is an enlarged sectional view taken along line 3B-3B of FIG. 3.".

Col. 5, line 63
Change "3 and 3A," to --3A and 3B,--.

Col. 7, line 61
Change "conducted way, or:" to --conducted away, or:--.

Col. 8, line 44
Change "of the a silicon" to --of a silicon--.

Col. 9, line 64
Change "the sensing heat" to --the sensing head--.

Col. 10, Line 3
Change "control of the temperature" to --control the temperature--.

Col. 11, Line 16
Change "devices can be" to --devices that can be--.

Col. 14, Line 3
Change "(ii) a source of excitation" to --(i) a source of excitation--.

Signed and Sealed this

Eighteenth Day of May, 2010

David J. Kappos
*Director of the United States Patent and Trademark Office*